(12) United States Patent
Honer et al.

(10) Patent No.: US 7,449,779 B2
(45) Date of Patent: Nov. 11, 2008

(54) WIRE BONDED WAFER LEVEL CAVITY PACKAGE

(75) Inventors: Kenneth Allen Honer, Santa Clara, CA (US); Giles Humpston, Aylesbury (GB); David B. Tuckerman, Orinda, CA (US); Michael J. Nystrom, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 158 days.

(21) Appl. No.: 11/322,617

(22) Filed: Dec. 30, 2005

(65) Prior Publication Data
US 2006/0220234 A1  Oct. 5, 2006

Related U.S. Application Data

(60) Provisional application No. 60/664,129, filed on Mar. 22, 2005.

(51) Int. Cl.
*H01L 23/48* (2006.01)
(52) U.S. Cl. .................. 257/737; 257/778; 438/108
(58) Field of Classification Search .......... 257/704, 257/787, 678, 730, 737, 778; 438/108
See application file for complete search history.

(56) References Cited

U.S. PATENT DOCUMENTS

| 5,611,876 | A | * | 3/1997 | Newton et al. ........... 156/89.12 |
|---|---|---|---|---|
| 5,798,557 | A | | 8/1998 | Salatino et al. |
| 6,075,712 | A | * | 6/2000 | McMahon .................. 361/783 |
| 6,094,138 | A | | 7/2000 | Eberhardt et al. |
| 6,214,644 | B1 | | 4/2001 | Glenn |
| 6,229,427 | B1 | | 5/2001 | Kurtz et al. |
| 6,285,064 | B1 | | 9/2001 | Foster |
| 6,384,397 | B1 | | 5/2002 | Takiar et al. |
| 6,624,505 | B2 | | 9/2003 | Badehi |
| 6,744,109 | B2 | | 6/2004 | Barton et al. |
| 6,777,767 | B2 | | 8/2004 | Badehi et al. |
| 6,972,480 | B2 | | 12/2005 | Zilber et al. |
| 6,995,462 | B2 | | 2/2006 | Bolken et al. |
| 2003/0038327 | A1 | | 2/2003 | Smith |

FOREIGN PATENT DOCUMENTS

| EP | 0 506 491 | 9/1992 |
|---|---|---|
| EP | 0 828 346 | 3/1998 |
| GB | 2 392 555 | 3/2004 |

\* cited by examiner

*Primary Examiner*—Roy K Potter
(74) *Attorney, Agent, or Firm*—Lerner, David, Littenberg, Krumholz & Mentlik, LLP

(57) ABSTRACT

A microelectronic device includes a chip having a front surface and a rear surface, the front surface having an active region and a plurality of contacts exposed at the front surface outside of the active region. The device further includes a lid overlying the front surface. The lid has edges bounding the lid, at least one of the edges including one or more outer portions and one or more recesses extending laterally inwardly from the outer portions, with the contacts being aligned with the recesses and exposed through them.

27 Claims, 17 Drawing Sheets

WIRE BONDED WAFER LEVEL CAVITY PACKAGE

CROSS-REFERENCE TO RELATED APPLICATIONS

This application claims the benefit of the filing date of U.S. Provisional Patent Application No. 60/664,129, filed Mar. 22, 2005, the disclosure of which is hereby incorporated herein by reference.

BACKGROUND OF THE INVENTION

Certain types of microelectronic devices are more vulnerable to chemical and mechanical damage than standard silicon semiconductors. For example many types of MEMS device have extremely fragile moving elements that can be destroyed by air currents. Surface Acoustic Wave (SAW) devices are fabricated with un-passivated aluminum metallisation and the frequency of operation will alter if the device is exposed to any polar liquid (including de-ionised water of the highest quality) and then dried off. Image sensors can have pixels obscured if particles fall on the active area of the die. For these devices there are advantages if the delicate member or area can be sealed in a protected environment as soon as possible after the wafer is completed. Various proposals have been advanced for attaching covers or lids to the wafer before severing the wafer to form individual chips. Despite all of this progress in the art, still further improvement would be desirable.

SUMMARY OF THE INVENTION

One aspect of the present invention provides a microelectronic device including a chip having a front surface and a rear surface. The front surface may include an active region and a plurality of contacts exposed at the front surface outside of the active region. The device also includes a lid overlying the front surface of the chip. The lid includes edges bounding the lid. At least one of the edges includes one or more outer portions and one or more recesses extending laterally inwardly from the outer portions. The contacts of the chip are preferably aligned with the recesses and exposed through the recesses.

A further aspect of the present invention provides an assembly including a microelectronic device as discussed above attached to a substrate. The rear surface of the chip may face downwardly toward the substrate, while the front surface of the chip and the lid face upwardly away from the substrate. The contacts of the chip may be connected to conductive elements on the circuit panel by leads such as wire bonds. In another embodiment, the circuit panel may include fingers extending into the recesses of the lid.

Another aspect of the invention provides a method of making a microelectronic device including assembling a lid element to a wafer element. The wafer element preferably includes a front surface having a plurality of regions wherein each such region includes an active area and a plurality of contacts exposed at the front surface outside of the active area. The lid element preferably overlies the front surface of the wafer element. Holes are formed in the lid element so as to expose the contacts. The wafer element and the lid element may then be severed along severance lines intersecting the holes to thereby form a plurality of units, wherein each unit includes a lid having one or more edges with recesses formed from the holes.

In a variant of this method, an electrically conductive material such as solder may be deposited into the holes prior to the step of severing the wafer and lid element.

In another method of making a microelectronic device, a lid element may be assembled to a wafer element such that the planar inner surface of the lid element faces toward a front surface of the wafer element. The wafer element is preferably divided into a plurality of regions wherein each such region includes an active area and a plurality of contacts exposed at the front surface in a peripheral area outside of the active area. The lid element preferably overlies the front surface of the wafer element with the inner surface spaced from the front surface of the wafer element. Portions of the lid element may be removed so as to expose the contacts disposed along the peripheral area. Subsequently the wafer element may be severed into individual units.

DETAILED DESCRIPTION

Figure 1:
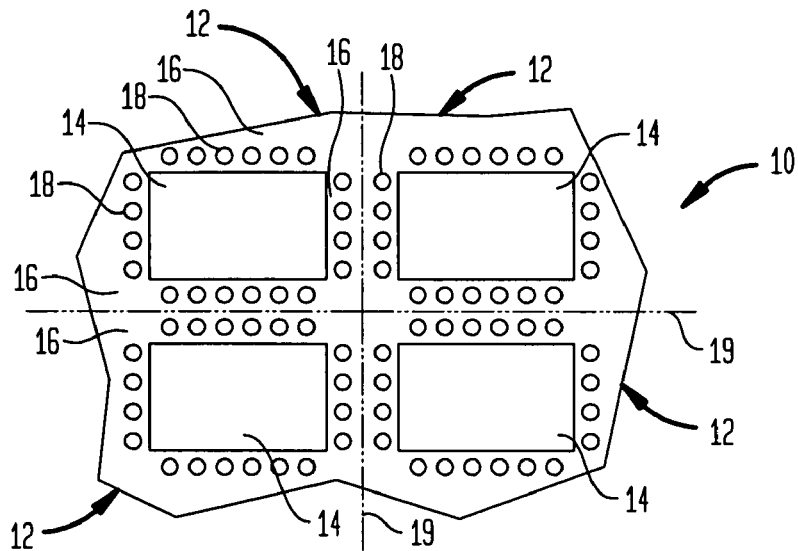
FIG. 1 is a fragmentary plan view of an element used in an assembly method according to one embodiment of the present invention.

A process according to one embodiment of the present invention uses a wafer element 10, such as an entire wafer or a part of a wafer. Only a small portion of the wafer element 10 is shown in the fragmentary plan view of FIG. 1. The wafer element 10 includes a large number of regions 12, each such region including an active area 14 and a peripheral area 16 disposed outside of the active area, on one or more sides of the active area. The active area 14 may include a portion of a microelectronic element or specifically a microelectronic chip. The front surface of the wafer element 10 is seen in FIG. 1. Each region 12 of the wafer 10 has exposed contacts 18 disposed in its peripheral area 16. In the particular embodiment depicted, the contacts 18 are disposed on all four sides of the active area, but contacts 18 may be provided on less than all sides of the active area 14. For clarity of illustration, the regions are demarcated by lines 19 at the boundaries between adjacent regions, but these lines may not be visible in actual practice.

In the next stage of the process, a lid element 20 such as a unitary sheet of glass or other material is assembled over the front surface 26 of wafer element 10. Where the finished device is intended to function as an imaging or light-emitting unit, the lid element 20 preferably is transparent to radiation at the relevant wavelengths. The lid element 20 desirably has a coefficient of thermal expansion substantially similar to the coefficient of thermal expansion of the wafer element 10. In this embodiment, the lid element 20 is a flat sheet, having a planar inner surface 22 and a planar outer surface 24. The lid element 20 is assembled so that the inner surface 22 overlies and faces toward the front surface 26 of the wafer element 10, the surface depicted in FIG. 1. The wafer element 10 also has an oppositely-directed rear surface 28.

A seal 30 is applied over the peripheral areas 16 of the wafer element 10, and hence over the contacts 18 of the wafer element, so that the seal extends between the front surface 26 of the wafer element 10 and the inner surface 22 of the lid element 20. For example, the seal 30 may be formed from an adhesive or other settable material applied to the wafer element 10 before application of the lid element 20. The seal forms a bond between the lid element 20 and the wafer element 10 in these regions.

Figure 3:
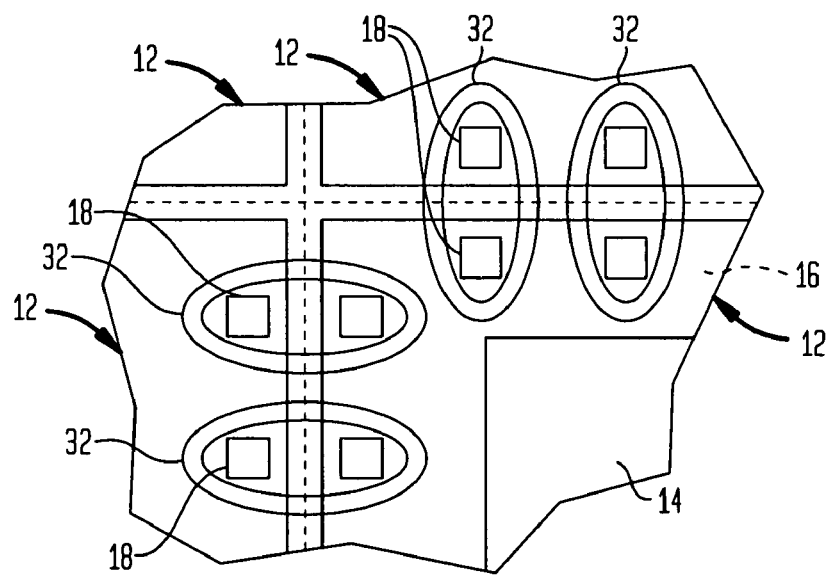
FIG. 3 is a fragmentary plan view of the elements of FIG. 2.

Desirably after the lid element 20 has been assembled, holes 32 are formed through the lid element 20 and through the seal 30 so as to expose the contacts 18 of the wafer unit. As best seen in the embodiment of the enlarged, fragmentary view of FIG. 3, each hole 32 in this embodiment extends across a boundary 19 between adjacent regions 12 of the wafer element 10, so that each hole 32 encompasses two contacts 18 on two mutually adjacent regions 12. As also shown in FIG. 3, each hole 32 in this embodiment is elongated in the direction transverse to the boundary 19, and has a generally oval shape. However, the holes 32 most desirably do not extend to the active areas 14 of the wafer regions, so that a continuous portion of the seal 30 remains intact, between the holes 32 and the active area of each region.

Figure 2:
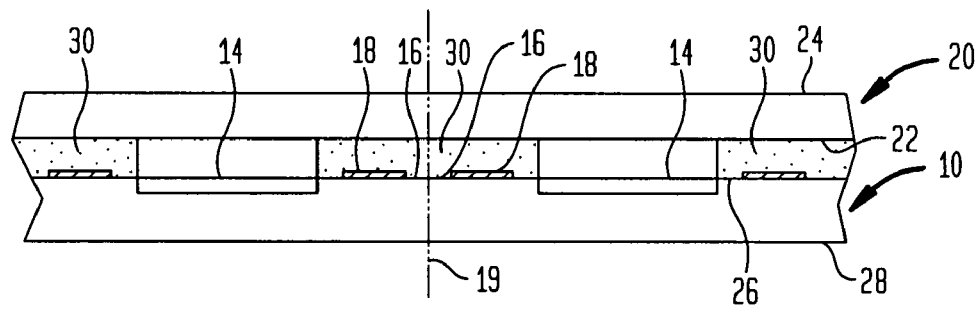
FIG. 2 is a cross-sectional view of the element of FIG. 1 in conjunction with another element at a later stage in the assembly method

The holes 32 can be formed by masking the lid element 20 and applying a suitable etchant, which attacks the material of the lid element 20. Once the holes 32 have penetrated the lid element 20, a solvent or etchant, which attacks the material of the seal 30 but which does not substantially attack the lid element, may be applied, until the holes reach the front surface of the wafer element 10 and the contacts 18. Mechanical etching processes also may be employed. Most preferably, holes 32 have a taper, preferably at a 20 degree angle although more acute and more obtuse angles in the range of 5 to 60 degrees are permissible, so that the dimensions of each hole (as seen in plan view in FIG. 3) decrease progressively in the downward direction, from the outer surface 24 (FIG. 2) of the lid element 20 to the inner surface 22, and, preferably, from the inner surface 22 to the front surface of the wafer 10.

Holes 32 provide access to the contacts 18 of the wafer 10 for test purposes but left unmetallised and unfilled. Thus, one or more test probes, such as an assemblage of test probes on a wafer probing device, may be engaged with the contacts 18 of the wafer element at this stage of the process to perform electrical and functional tests of the individual regions.

After the holes 32 have been formed, the wafer 10 is severed along the boundaries of the regions, as by sawing or other conventional dicing processes. The severing process thus cuts the wafer element 10 and the lid element 20 along planes coincident with the boundaries 19 of the regions on the wafer element, so as to form individual units, each including one region 12 of the wafer element 10 and an overlying portion of the lid element 20. The severance planes 19 intersect the holes 32. Each individual unit resulting from the process includes a chip 10' formed by a region 12 of the wafer element 10 and a lid 20' (FIG. 4) formed by the overlying portion of the lid element 20. The lid 20' of the individual units has scalloped edges, so that the lid as seen in plan view has an appearance resembling a postage stamp. Thus each scalloped edge has outer portions 40 at the outermost edges of the unit that are flush with the edges of the chip 10', as well as recesses 32' formed from the holes 32, the recesses extending laterally inward from the outer portions so that the contacts 18 remain exposed within the recesses. Stated another way, the outer portions 40 project outwardly over the peripheral regions between adjacent contacts 18.

Figure 4:
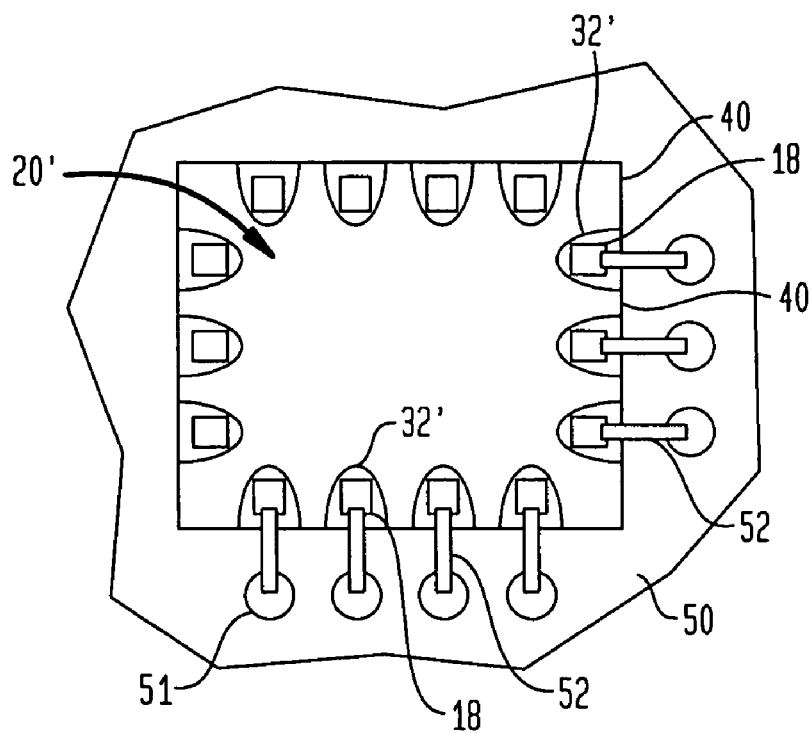
FIG. 4 is a plan view of a unit formed in the method of FIGS. 1-3 in conjunction with another element.
Figure 5:
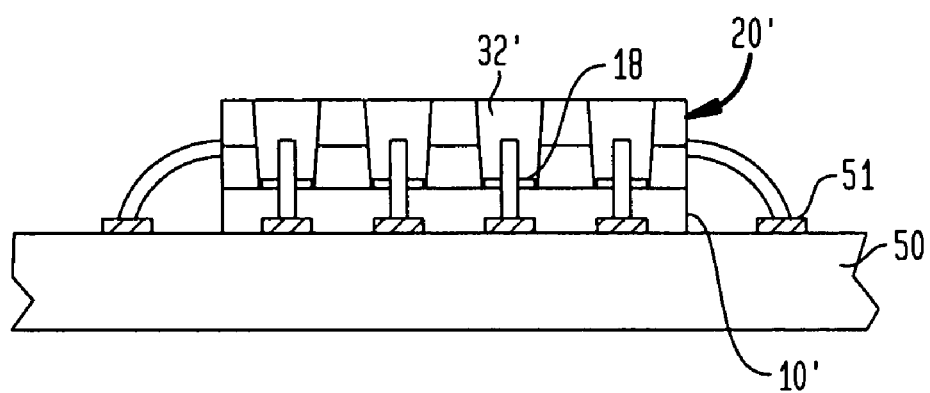
FIG. 5 is a cross-sectional view of the unit of FIG. 4.

The scalloped edges provide access to the contacts 18 so that the contacts may be wire bonded as described below. Thus, as seen in FIGS. 4 and 5, the unit may be disposed on a circuit board 50 or other substrate, with the rear surface of the chip 10' facing downwardly toward the substrate and with the lid 20' facing upwardly, away from the substrate. Wire bonds 52 or other types of leads may be connected between the contacts 18 and electrically conductive features of the substrate such as conductive pads 51. In a wire bonding process, a fine wire is dispensed from a tool, also referred to as a capillary, which is used to apply heat and/or vibration and pressure to the wire to bond the wire to the contact 18, whereupon the tool is retracted while paying out the wire and moved until the tool encounters the conductive pad 51 of the substrate, where another bond is formed and the wire is severed. The capillaries used to form wire bonds have tapered ends and thus the tool fits readily into the tapered recesses 32' formed from the tapered holes. Most preferably, the wire bonding process is conducted so that each wire bond is left partially recessed in its own individual cavity formed by one of the recesses 32'. This decreases the risk of mechanical damage and damage caused by a flowing encapsulant or overmolding material when the assembly is encapsulated or over-molded. Such damage is commonly referred to as "wire sweep." In the drawings, the thickness of lid 20' is exaggerated for clarity of illustration; the wire bond may project upwardly, above the lid, depending on the configuration of the wire bond and the thickness of the lid.

As there exists grades of glass that are expansion matched to most semiconductor materials this material is frequently chosen for the package lid. The taper angle of the recesses 32' assists with providing access to the contacts 18 while minimizing the volume of lid material that has to be removed. The taper angle also assists with visual inspection of the alignment of the lid 20' to the device wafer since there are likely to be fewer problems and errors compared with a vertical wall, especially if the lid is comprised of a transparent material such as glass. A further benefit of the scalloped edge is that the outer portions 40 provide reinforcement to the peripheral areas and edges of the device wafer. If all of the lid material overlying the peripheral areas of the wafer is simply removed to expose the contacts 18, the edge of the die is more vulnerable to mechanical damage as a thin ledge protrudes from the device package. The taper also aids this reinforcing action. The taper angle also increases the interfacial area between the glass and the polymer coating that has to be applied to the bond wires 52 to provide them with environmental protection. Moisture ingress along this interface is a known failure mechanism.

The process provides for access to the device contacts 18 while the die are still at the wafer level. This opens the possibility of conducting electrical, optical and other test of the device after packaging is complete. Thus the normal pre-wafer probe test and post-packaging tests can be combined in a single operation, that minimizes handling of the components and eliminates one relatively expensive process from the manufacturing process flow. Also, because the holes 32 preferably are formed after assembly of the lid element 20 to the wafer element 10, it is not necessary to precisely position the lid element relative to the wafer element. In other embodiments, however, the holes 32 can be formed prior to assembly of the lid element 20 to the wafer element 10.

Figure 6:
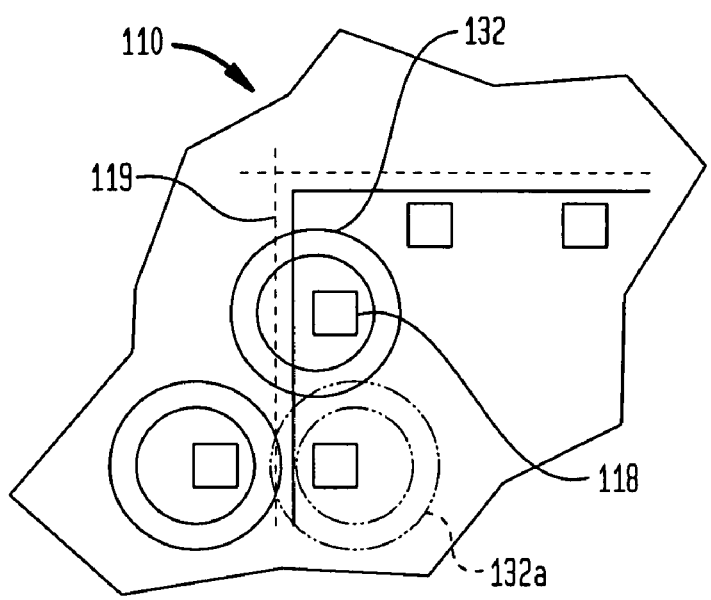
FIG. 6 is a fragmentary plan view of elements used in an additional embodiment of the present invention.

In a variant depicted in FIG. 6, each hole 132 is circular as seen in plan view, and encompasses only one contact 118 on one region 112 of the wafer element 110. The hole 132 extends into a dicing lane, and hence extends to and across the region boundary 119. Then, when the wafer element 110 and lid element are singulated, each hole 132 will form a recess similar to those discussed above, and hence will provide both vertical and edge-opening access to the contacts 118. This approach is limited in its applicability because the need to make a given number of connections to the die means that it will have a certain number of contacts, which will often be closely spaced. This is apparent from FIG. 6, where it can be seen that adjacent, tapered, through holes 132 and 132a would substantially overlap.

Figure 7:
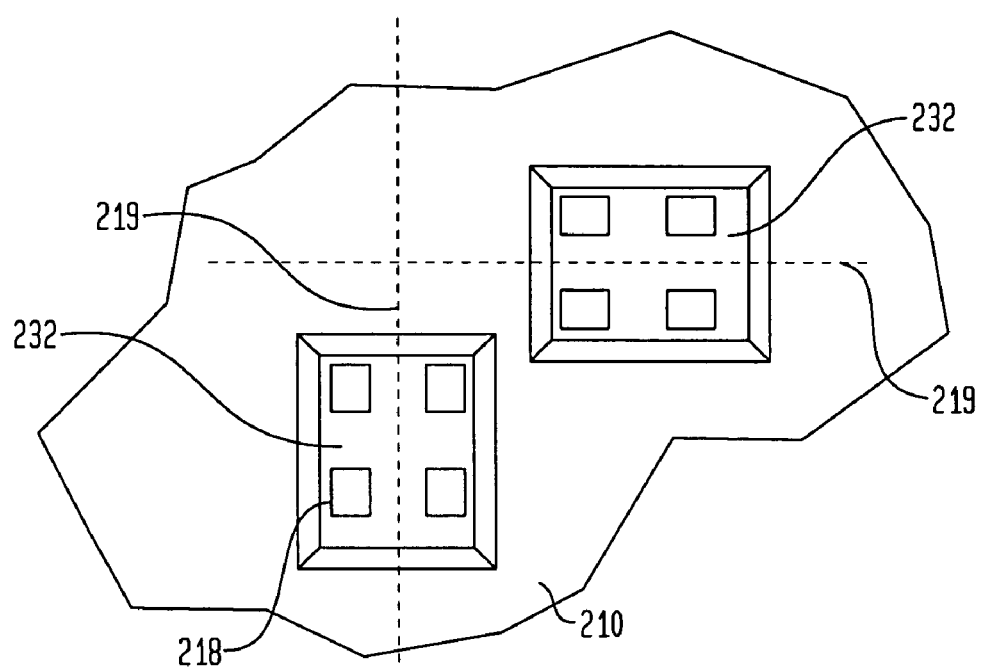
FIG. 7 is a view similar to FIG. 6 depicting elements of an additional embodiment.

It is possible to further simplify the through hole structure by combining a number of adjacent through holes. For example, as in the embodiment depicted in FIG. 7, each through hole 232 is generally rectangular as seen in plan view, and encompasses two contacts 218 on each of two mutually-adjacent regions of the wafer element 210. In further variants, the holes can be further elongated in directions parallel to the boundaries 219 between the regions, i.e., parallel to the dicing lanes used in the severing step. Such elongated holes may form a slot along each side of the region where there are contacts, so as to provide an elongated recess along each edge of the completed unit. Even in this embodiment, however, it is desirable to provide one or more outer portions of the lid element projecting over the peripheral areas of the chip as, for example, at the corners of the unit, so as to reinforce the chip. Desirably, in this approach the lid element is made of material with moderate to high fracture toughness. This is because the slots leave only thin webs of material at the corners of adjacent die that will fracture readily if the lid element is made of a material with low fracture toughness, like glass. In this regard, having oval, tapered though holes, as shown in FIGS. 1-5, is preferable for lid materials of low fracture toughness. For this same reason it is still preferable for the edges of the slots to be tapered since this structure maximizes the volume of material remaining and hence its ability to resist deformation and fracture. The elongated slot structure also increases the risk of physical damage to the unsupported edge of the device and also damage to the fully exposed bond wires.

Because slots that cover a number of adjacent contact pairs provide some advantages in terms of ease of formation of wafer level cavity packages and alignment to the device wafer, similar structures that use more robust parts are highly attractive. In a further variant, shown in FIGS. 8A-8D, a planar lid unit 320 is laminated to the wafer unit using adhesive seals 330 covering the peripheral areas, contacts 318 and region boundaries 319, in much the same way as discussed above with reference to FIGS. 1-5. In this embodiment, and in the embodiments discussed above, seals 330 may be formed by a film of adhesive material that is pre-punched to form holes corresponding to the active areas of the wafer element. Here again, there is no need for precise lateral alignment of the lid element 320 and wafer element 310.

Figure 8A:
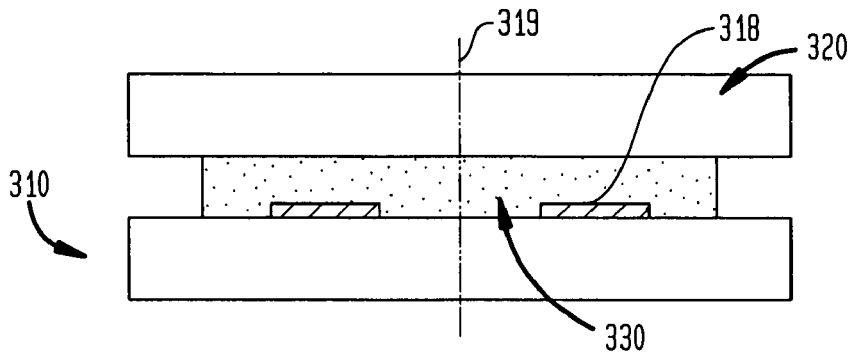
FIGS. 8A-8D are cross-sectional views depicting elements used in an additional method of assembly according to a further embodiment of the present invention.
Figure 8B:
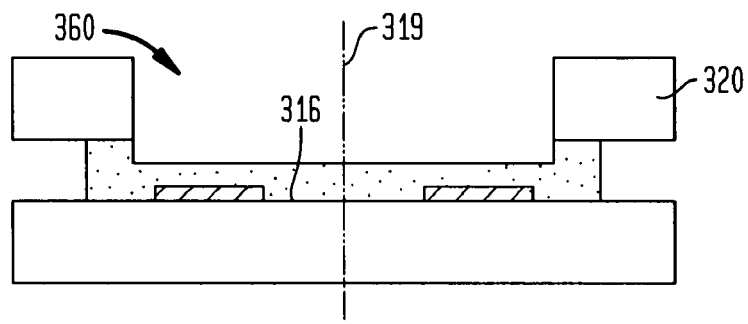
Figure 8C:
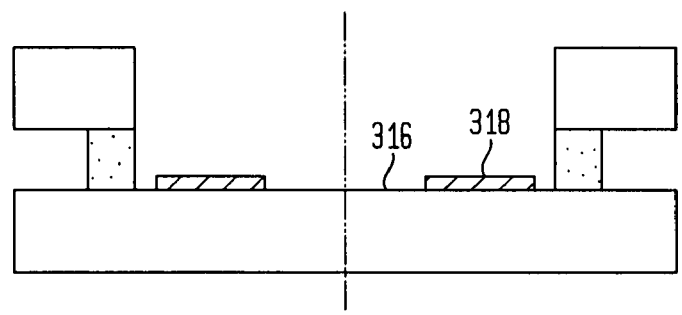
Figure 8D:
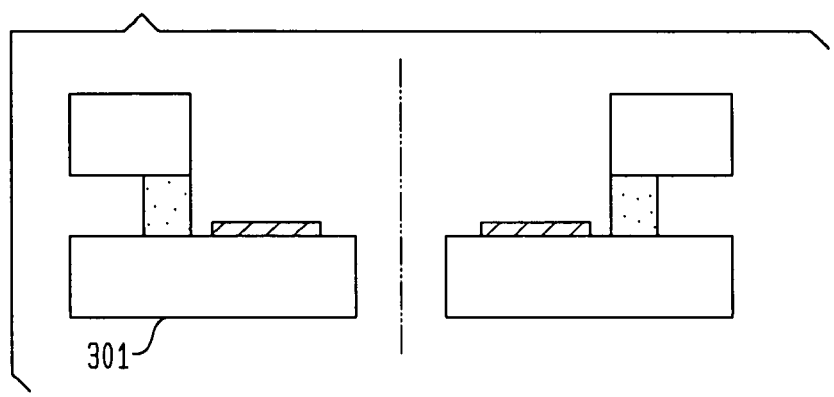

After assembly of the lid element 320 and wafer element 310, an orthogonal array of trenches 360 (FIG. 8B) of a controlled depth is formed in the lid element 320. The array of trenches 360 is preferably in alignment with the region boundaries 319 and the peripheral areas 316 of the various regions. The trenches 360 may be formed by masking and etching or, more preferably, by dicing using a saw or abrasive. Ideally, the trenches 360 will penetrate the seal 330, but not the wafer element 310. The seal material exposed by the trench 360 can then be removed by laser ablation, dissolution in chemical solvents or a plasma process, so as to leave the peripheral areas 316 and contacts 318 of the various regions exposed (FIG. 8C). Following formation of the trenches 360, the wafer element 310 is severed along the boundaries 319, so as to form individual units 301. (FIG. 8D).

Figure 9A:
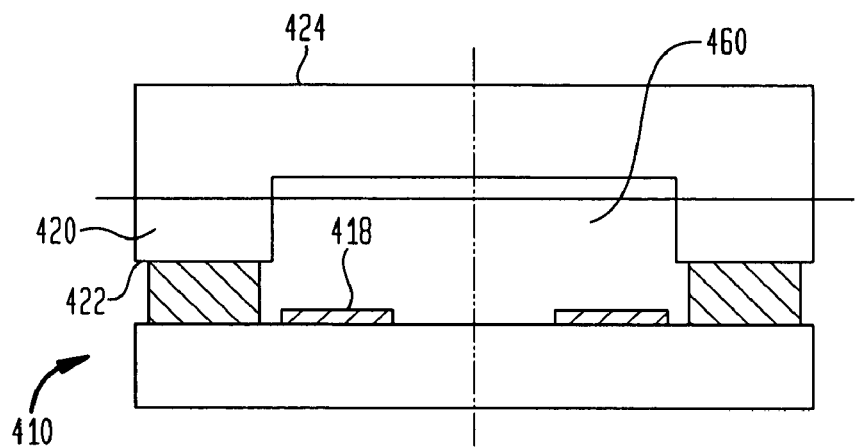
FIGS. 9A-9C are cross-sectional views of elements used in yet another method of assembly according to a further embodiment of the present invention.
Figure 9B:
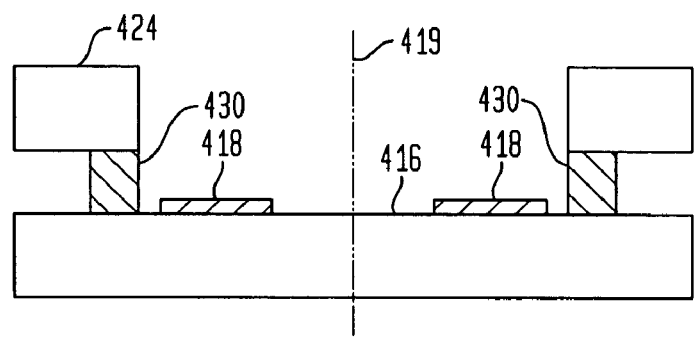
Figure 9C:
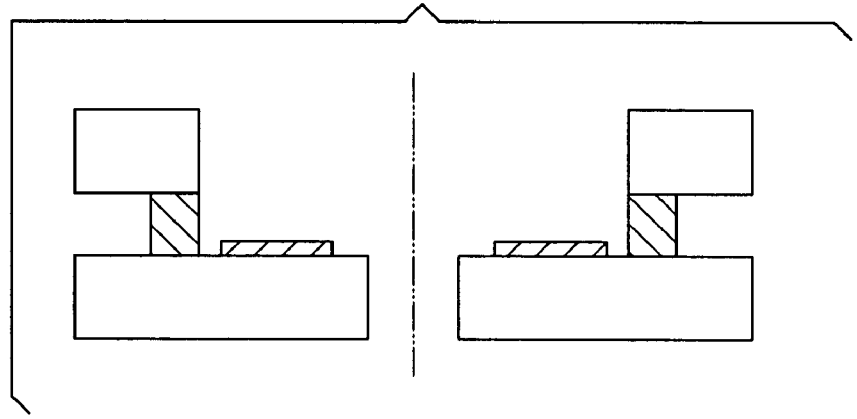

A thick lid will provide mechanical support to the device wafer and this approach may therefore be attractive in situations where it is desirable to thin the device wafer at some point in the assembly sequence. In a process according to a further embodiment, a thick lid element 420 (FIG. 9A) has trenches 460 formed in it in an array corresponding to the dicing lanes on the device wafer 410. The trenches 360 extend into the lid element 420 from the inner surface 422, i.e., the surface of the lid element facing toward the wafer element 410. Thus, the trenches 460 desirably are formed prior to assembly of the lid element 420 and wafer element 410. The trenches 460 are of sufficient width so that when aligned and placed on the wafer element, each trench encompasses the peripheral regions 416 and contacts 418 on adjacent regions, lying on opposite sides of the region boundary 419, as shown in FIG. 9A. In this embodiment, the seal 430 does not cover the contacts 418. After assembly of the lid element 420, the lid element is reduced in thickness by mechanical abrasion or chemical or gaseous processing until the previously formed trenches 460 are exposed, as shown in FIG. 9B. The thinning process may be non-selective, i.e., the thinning process may remove material from all areas of the outer surface 424 of the lid element 420. After the thinning process, the wafer element 410 is severed to leave individual units (FIG. 9C). Alternatively, the same end result is obtained if the wafer element 410 is singulated prior to thinning the device wafer. In a further variant, the seal 430 may cover the peripheral areas 416 of the wafer element 410, and portions of the seal element 430 aligned with the trenches 460 may be removed after they are exposed by the thinning step.

Figure 10A:
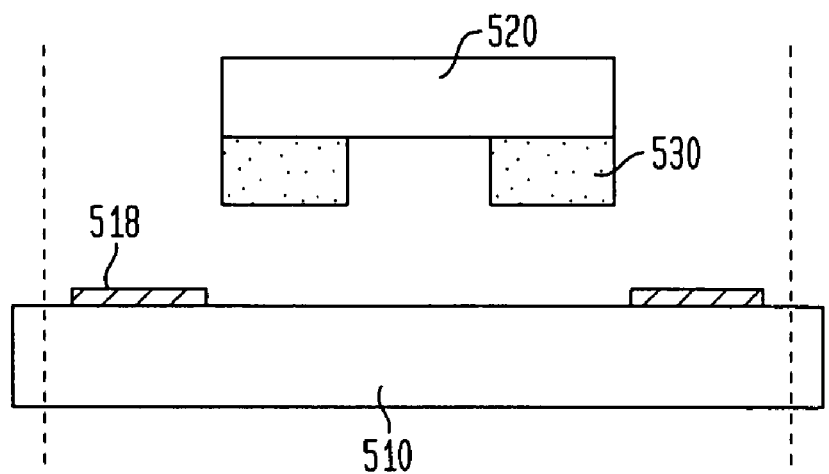
FIGS. 10A-10B are cross-sectional views of elements in a still further embodiment of the present invention.
Figure 10B:
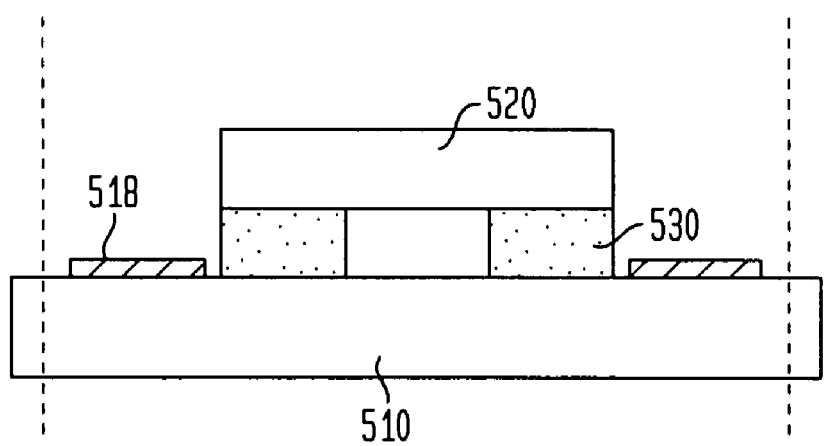

The methods discussed above have used wafer-scale processing to achieve the final structure. It will be apparent that the same end products can also be made by assembling individual lid elements 520 with a wafer element 510 in a whole wafer form or other form incorporating plural regions and hence plural chips, as seen in FIGS. 10A and 10B. The basis of this method is to obtain the lid material in the appropriate dimensions to cover the areas on each die that require protection. Such an individual lid element 520 may be a simple rectangle or may have scalloped edges as discussed above with reference to FIGS. 1-5. The picture frame of adhesive or other seal material 530 is then placed on each lid element 520 or each device, whichever proves to be the easiest. The lid elements 520 are then individually picked, aligned and placed, one on each die or region. The wafer element 510 is then severed (singulated) to form the individual units, each with their own contacts 518. Indeed, it is possible to form the structure at the individual die level, by assembling individual lids with individual chips. These approaches are likely to be more expensive solutions than those disclosed previously since all the assembly operations need to be repeated for each individual die, whereas in the methods described above they are all performed in parallel.

In further variants, an impermeable material such as a metal may be deposited over the exposed edges of the seal at any time after these edges are exposed. For example, in the process of FIGS. 8A-8D, an impermeable material may be deposited while the assembly is in the form of FIG. 8C. Such a step may be performed as described in copending, commonly assigned U.S. patent application Ser. No. 10/949,674, filed Sep. 24, 2004, the disclosure of which is hereby incorporated by reference herein.

Figure 11A:
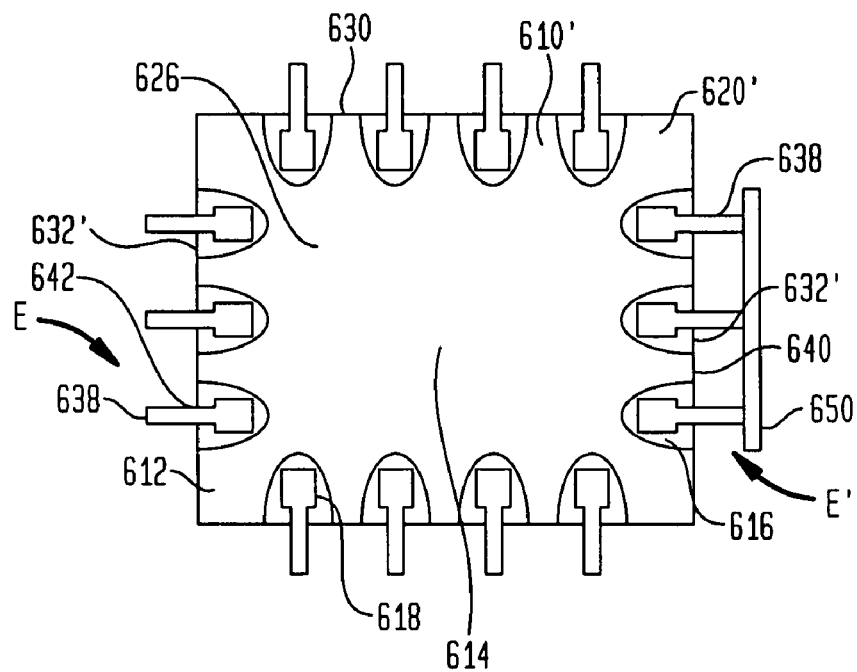
FIG. 11A is a plan view of a unit according to a still further embodiment of the present invention.
Figure 11B:
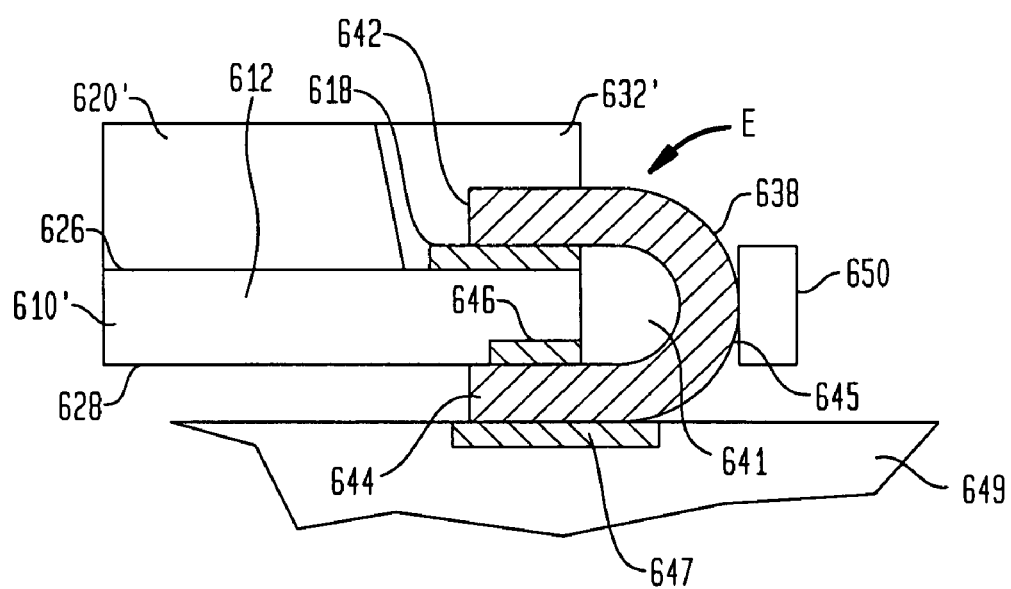
FIG. 11B is a cross-sectional view of the embodiment illustrated in FIG. 11A.

In the embodiment of FIGS. 11A-11B, the contacts exposed in the peripheral area of the front surface of the wafer element may be electrically connected to clips. Similar to embodiments described above, an individual chip 610' may include a small portion of a wafer element and have an active area 614 and a peripheral area 616. The active area 614 and a portion of the peripheral area 616 are covered by a sealing material 630 and lid 620' as described with regard to the embodiment illustrated in FIGS. 1-5. Contacts 618 are exposed at a front surface 626 of the chip 610' along the peripheral area 616. Portions of the lid 620' may extend between adjacent contacts 618, as shown in the figures. As discussed with regard to previous embodiments discussed herein, the sealing material (not shown) between the lid 620' and the chip 610' may also extend between adjacent contacts 618.

A plurality of clips 638 may be engaged with contacts 618. In the embodiment of FIGS. 11A and 11B, each clip 638 is C-shaped as shown in the figures and spans the thickness of the wafer 610 such that a portion of the wafer is engaged within a channel 641 of the clip 638, the channel being defined by a first end 642 of the clip and a second end 644. Thus, the clips 638 extend from a front surface 626 of the wafer to a rear surface 628. The first end 642 of each clip 638 may be mounted to a single respective contact 618, as shown at edge E of the chip 610' in FIG. 11A. Since each contact 618 is housed within a single recess 632', adjacent clips 638 are also separated from each other at a distance equal to the width of the scalloped walls of the outer portion 640 disposed between adjacent recesses.

Optionally, as shown at edge E' of the chip 610', a plurality of clips 638 may be mounted to a permanent or temporary support structure 650. Adjacent clips 638 are separated from one another on the support structure 650 by a distance corresponding to the distance between adjacent contacts. Arches 645 of the clips 638 are attached to the support structure 650, with the first and second ends 642, 644 of the clips all facing the same direction, away from the support structure. Thus, the open ends of the channels 641 are also remote from the support structure 650. The support structure 650 may be brought into proximity of edge E' of the chip 610' such that portions of the edge E' are received within the channels 641 of the clips 638. Preferably, as the support structure 650 is bought into proximity of the edge E', it remains parallel to the edge E' so that the clips 638 may be aligned with the contacts 618. As the edge E' is positioned deeper into the channels 641 of the clips 638, the first ends 642 of the clips 638 engage the contacts 618 and the second ends 644 of the clips 638 engage the conductive features 646. Since a plurality of clips 638 are mounted on the support structure 650, the clips engage respective contacts 618 and conductive features 646 simultaneously. If a single clip 638 should become displaced from the support structure 650 such that the clip does not extend perpendicularly therefrom, the scalloped walls may aid in directing the clip toward the correct contact 618. Thus, the scalloped walls of the outer portion 640 also help prevent adjacent clips 638 from contacting one another or becoming misaligned. Once the clips 638 are positioned correctly, the support structure 650 may be removed from the clips or the support structure may be severed at locations between adjacent clips so that various clips are not in electrical communication with one another. If the support structure 650 is made from a dielectric material, it may remain attached to the clips 638.

The clips 638 may be comprised of an electrically conductive material as for instance a metal. In one preferred embodiment the clips 638 include a copper or copper alloy core and a surface finish of nickel overlaid with gold. The copper core provides the majority of the current carrying capacity as well as the elasticity of the clip. The nickel serves as a solderable metal, while the gold provides a low and stable contact resistance to the contacts 618. In order to ensure that the clips are firmly held to the chip, the distance from the first end 642 to the second end 644 of the chip 638, in a direction perpendicular to the two ends may be slightly less than the distance between a face of the contact 618 and the rear face 628 of the chip, such that when the ends of the clip engage the contacts and conductive features, respectively, the ends 644 and 642 are biased towards each other by the resilience of the clip itself, and end 642 firmly engages the contact 618.

The second ends 644 of the clips 638 may be attached to conductive features such as pads 647 of a substrate 649 (FIG. 11B), so as to mount the unit in a face-up disposition on the substrate. For example, the ends 642 may be solder-bonded to pads 647. As also shown in FIG. 11B, the second ends 644 of some or all of the clips 638 optionally may be electrically connected to conductive features 646, which may include conductive pads, traces and the like, exposed at the rear surface 628 of the chip 610', if the chip has such features. Certain chips have electrically-conductive ground planes on their rear surfaces. One or a few clips may engage the ground plane, whereas the remaining clips may be isolated from the ground plane.

Figure 11C:
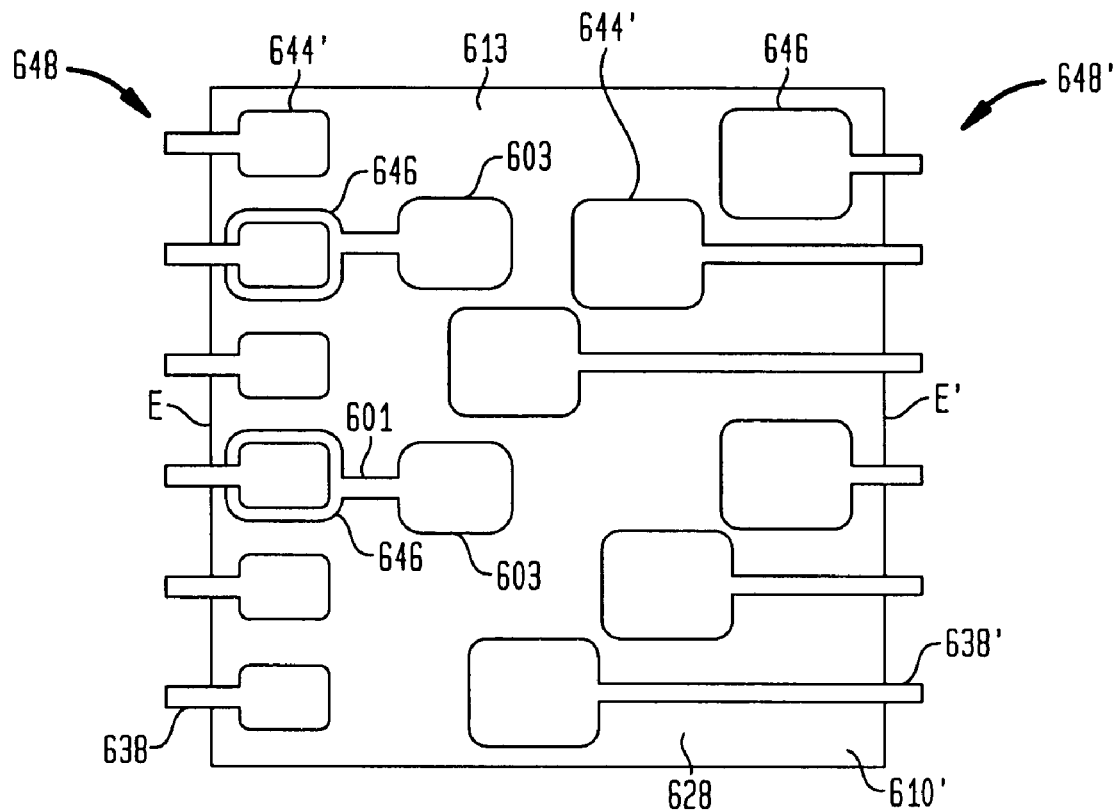
FIG. 11C is a bottom plan view of a unit according to a further the embodiment of the invention.

As shown in FIG. 11C, a clip array 648, which is positioned adjacent edge E, may include clips 638, each having a second end 644 that extends substantially the same length from the edge of the chip 610' onto the rear surface 628 of the chip 610'. As also shown in FIG. 11C, the conductive features 646 on the rear surface of the chip may include redistribution traces 601 connected to pads 603. The pads 603 may be distributed over substantially the entire rear surface of the chip. This arrangement provides an array of pads which can be spaced apart from one another at a larger spacing distance or "pitch" than the pitch or spacing distance of the ends 644' along the edge E'. The large pitch facilitates solder-bonding pads 603 to a circuit board or other substrate.

In another arrangement, also shown in FIG. 11C, the second ends 644' of the clips may extend to different lengths from the edge E'. By staggering the lengths that the second ends 644 of the clips 638 extend across the rear surface 628 of the region 612, the second ends 644' of the clips are disposed at a larger pitch. Thus, second ends 644' may be larger in size, which facilitates solder-bonding to a substrate.

Figure 11D:
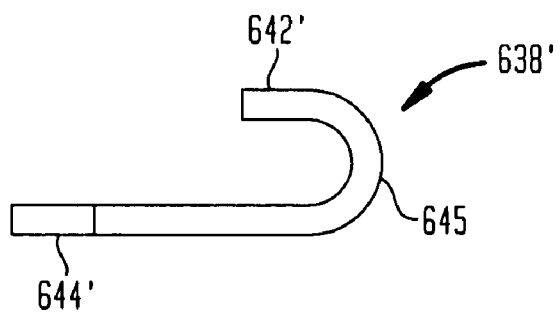
FIG. 11D is an elevational view of a component used in the unit of FIG. 11C.

The clips 638' may have asymmetrical shapes. For example, as best seen in FIG. 11D, the first end 642' of the clip is disposed closer to arch 645 than the second end 644'. Clips of this type may be used to provide the staggered arrangement of second ends shown in FIG. 11C.

Figure 12A:
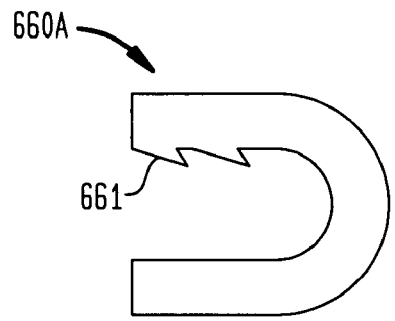
FIGS. 12A-12B are elevational views depicting components used in additional embodiments of the invention.
Figure 12B:
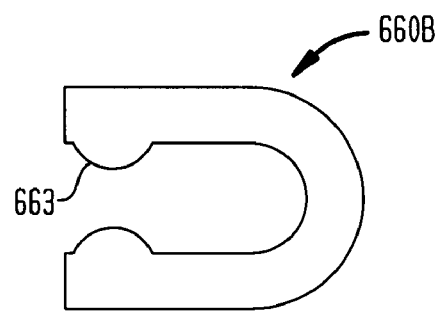

As shown in FIG. 12A, the clips 660A may include barbs 661 disposed on either or both ends of the clips. The barbs 661 anchor the clips to contacts or conductive features (not shown) and inhibit the clip from becoming disengaged from the chip. Alternatively or additionally, clips 660B may be provided with rounded protrusions 663 at one or both ends of each clip, as shown in FIG. 12B. The rounded protrusion 663 renders the insertion and removal of the clips 660B from engagement with the contacts or conductive features easier, since the surface contact area between the clips and the contacts and the rear surface of the chip is reduced.

Figure 12C:
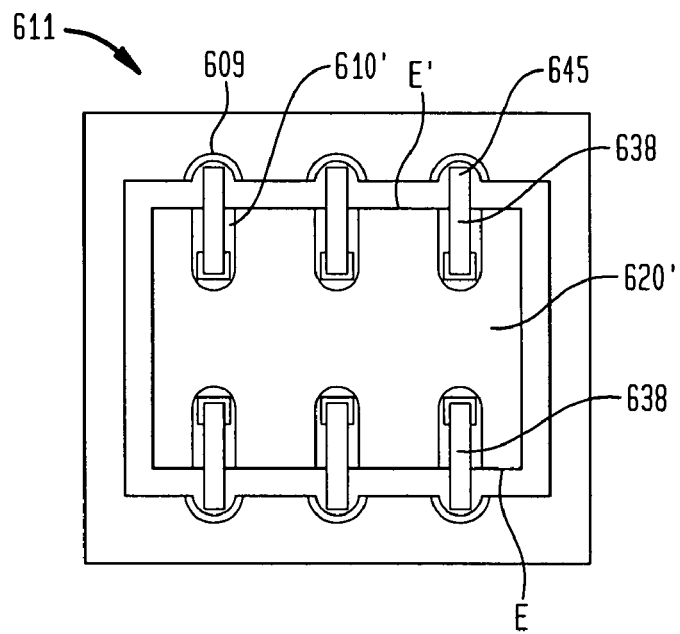
FIG. 12C is a plan view of an assembly according to a further embodiment of the invention.

However, since the clips extend around an edge of the chip, the clips also allow connection of the chip to be electrically connected to an additional microelectronic element at an edge of the chip. For example, as seen in FIG. 12C, the arches 645 of the clips 638 extend outwardly past the edges E, E' of the chip 610' and lid 620'. Thus, the unit including the chip and lid may be inserted into a socket 611 so that the arches of the clips engage conductive elements 609 of the socket. Where the unit forms part of a camera module, the socket may be arranged according to a design standard for camera modules as, for example, the SMIA (Standard Mobile Imaging Architecture) design standards. In other variants, the arches or other features of the clips projecting beyond the edges can be connected to other elements. For example, where clips are provided along one edge of the unit, the projecting clips may be solder-bonded to contact pads of a circuit panel (not shown) to hold the unit in an edge-mounted orientation, with the planes of the chip and lid extending generally perpendicular to the plane of the circuit panel.

Figure 13A:
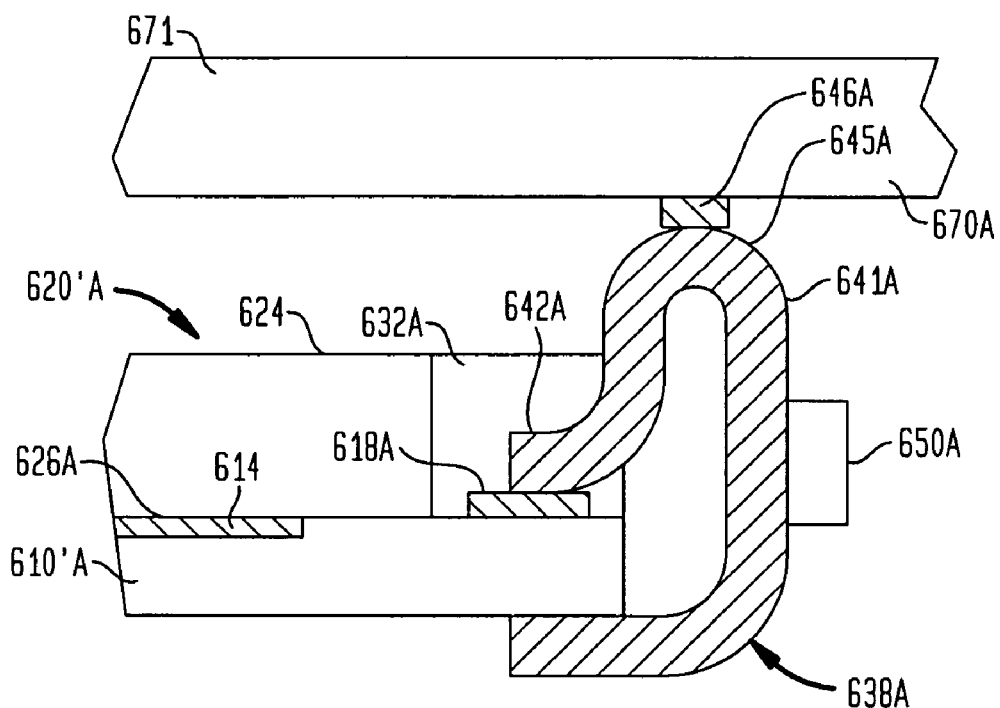
FIG. 13A is a fragmentary, cross-sectional view of an assembly according to yet another embodiment of the present invention.

In some cases, it may be desirable to mount the unit in a face-down orientation, where the lid faces toward the substrate. The clips may be provided with a mechanism or structure that permits the unit to be electrically connected to a substrate such as a circuit panel, in a face-down orientation. For example, as shown in FIG. 13A, each clip 638A may have a configuration that includes a middle portion 641A that extends beyond the outer surface 624 of the lid 620A', remote from chip 610A'. The middle portion 641A is disposed between a first end 642A of the clip 638A and a second end 644A. As can be seen in the figure, the first end 642A of each clip 638A is engaged to a contact 618A disposed within a recess 632A', similar to the embodiment described with regard to FIGS. 11A-11B. In the embodiment of FIG. 13A, the second end 644A is not engaged with conductive features on the rear surface of the chip or bonded to a substrate. Instead, the second end 644A serves simply as a clamping mechanism, along with the oppositely facing first end 642A, thereby holding the clips 638A to the chip 610A'.

With a portion of the clip 610A' extending beyond the lid 620'A, the unit may be mounted in a face-down orientation such that the front surface 626A of the chip and the outer surface 620'A of the lid face toward a substrate such as a circuit panel 670A or the like. In this arrangement, the middle portion 641A, and specifically arch 645A, is aligned and engaged with a conductive feature 646A exposed on the circuit panel 670A. The arches 645A and the conductive features may be bonded together using methods described herein or otherwise known to those in the art. Where the chip is an imaging chip having an active region 614 of the front surface adapted to receive light, the substrate 670A may have a hole 671, partially depicted in FIG. 13A, to pass light through to the unit.

As with clips described above, the clips 638A may be placed in position relative to the contacts 618A and recesses 632A' individually or the clips 638A may be placed in position simultaneously with the use of a support structure 650, which can be mounted to the clips 638A, as shown in the figure.

Figure 13B:
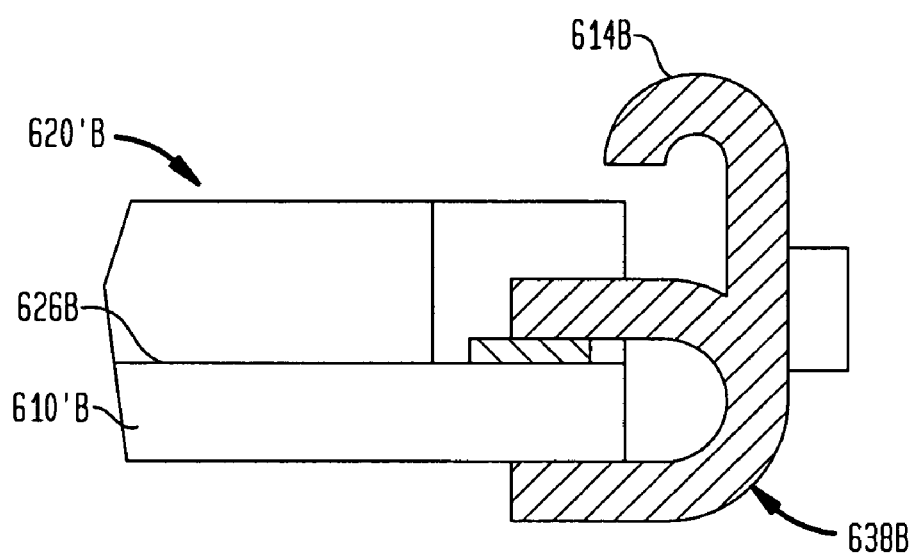
FIG. 13B is a view similar to FIG. 13A but depicting a further embodiment of the present invention.

In an alternate embodiment of a face-down mounting arrangement, as shown in FIG. 13B, the clips 638B may include an extension 641B' that extends beyond the body portion of the clip and above the lid 620B'. Similar to the middle portion 641A described above, the extension 641B' enables the chip 610B' to be mounted in a flip-chip mounting arrangement. Clips 638B are generally similar to clips 638A and may be mounted to the chips much in the same way clips 638A are. As can be seen when comparing FIG. 13B to FIG. 13A, the only structural difference between the two elements, is that the extension 641B' extends outwardly from a main body of the clip 638B, whereas the middle portion 641A and arch 645A are incorporated into the main body of the clips 638A. The clips 638B may allow for more flexibility between the chips 610B' and the substrate to which the chips are mounted, due to the ability of the extension 641B to bend in a direction parallel to the front surface 626B of the chip. In contrast, the clips 638A may provide greater structural integrity, as the middle portion 641A is bonded at both of its ends to the rest of the clip.

Figure 13C:
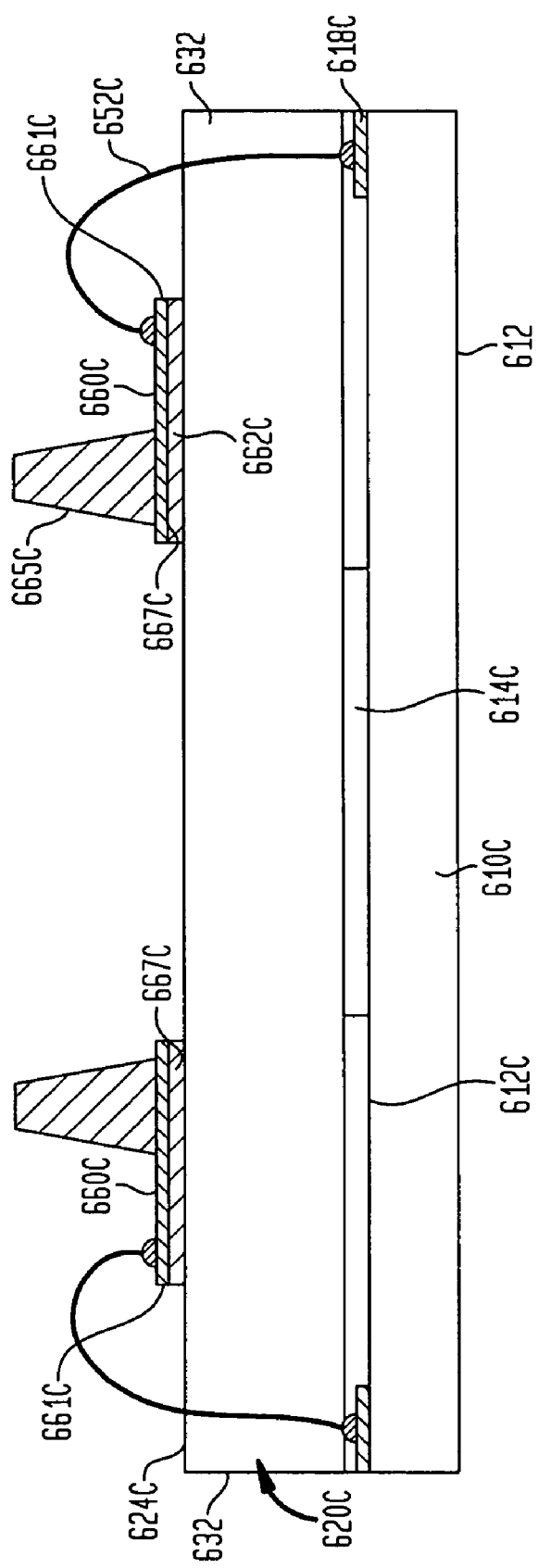
FIG. 13C is a sectional view depicting unit according to yet another embodiment of the invention.

In still yet another alternate embodiment of a face-down mounting arrangement as shown in FIG. 13C, a unit 612C having a lid 620C and chip 610C generally similar to the chip and lid discussed above with reference to FIGS. 1-5, includes conductive features such as a metal trace 660C disposed on the outer surface 624C of the lid element 620C. Traces 660C includes wire bond pads 661C and terminal ends 667C. The wire bond pads 661C desirably are disposed adjacent to the recesses 632 of the lid. The terminal ends may be placed as desired over the area of the lid outer surface 624. The traces 660C may consist of metal deposits directly placed onto the lid 620C' or, as shown in the figure, a compliant layer 662C may be disposed under the trace. In additional embodiments, the trace 660C may also be selectively covered by a solder mask or other dielectric coating at locations other than the terminal ends 667C and bonding pads 661C. Solder bumps, balls, pins or other electrically conductive elements 665C may be provided on the terminal ends 667C of the traces 660C. The conductive elements 665C can be used to connecting of the unit to an external substrate (not shown) in face-down orientation, with the outer surface 624C facing toward the substrate. Here again, the substrate may include a hole that is aligned with the active area 614C of the chip. The traces 660C, and hence the conductive elements 665C, are electrically connected to the contacts 618C of the unit as, for example, by wire bonds 652C extending from the bond pads 661C, to the terminals 618 of the chip. The wire bonds extend into recesses 632 of the lid, so that the chip is electrically connected to the substrate by the wire bonds 652C, traces 660C and conductive elements 665C. In a variant of this approach, the conductive elements 665C are omitted from the unit, so that the terminal ends 667C of the traces are exposed and serve as terminals for connecting the unit to an external circuit. For example, the terminal ends 667C of the traces may be bonded to a substrate such as a circuit panel by solder masses applied to the substrate before placing the unit on the substrate.

Figure 14:
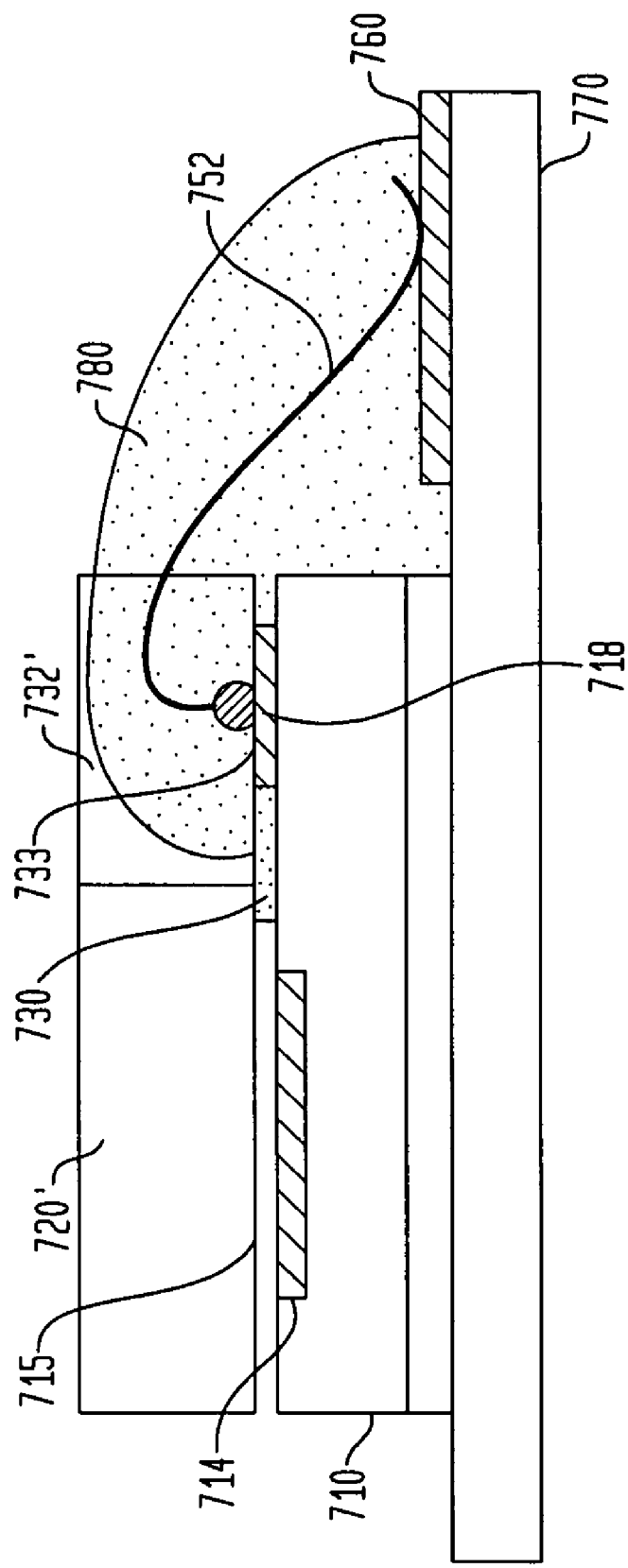
FIG. 14 is a fragmentary cross-sectional view of an assembly according to another embodiment of the present invention.

As illustrated in FIG. 14, the wire leads 752, may be coated with a material that increases the mechanical integrity of the wire leads as well as improves their resiliency to corrosion. Normally, this may not be possible when the active area of a chip is an image sensor die because the coating material, usually applied as a viscous liquid, may still bleed onto the sensor area and reduce the ability of the sensor to detect images. But with the active area of the chip being protected by a lid as described herein, the fear of the coating material bleeding onto the active area is eliminated.

In an assembly according to a further embodiment of the invention (FIG. 14), a chip 710 having an active, imaging area 714 is provided with a lid 720, and a sealing material 730, similar to the corresponding elements described with regard to FIGS. 1-5. The lid, chip and sealing material enclose a cavity 715 over the active area 714 of the chip. As with the embodiment shown in FIGS. 1-5, contacts 718 are disposed in recesses 732 that are formed by creating holes etching and then dicing of the wafer into individual units, as earlier described. The unit is mounted face-up on a substrate or circuit board 770, and contacts 718 of the chip are connected to contact pads 760 of the substrate by leads in the form of wire bonds 752 which extend into the recesses 732 of the lid. In this embodiment as well, adjacent contacts 718 and the adjacent wire bonds 752 are separated from one another by a scalloped wall of the outer portion defining the recesses 732.

A coating material or encapsulant 780 may be disposed in and around wire leads 752, contacts 718 and conductive elements 760 to increase the integrity of the features and their resistance to corrosion. During application of the encapsulant, the scalloped walls help to maintain a safe distance between adjacent wire leads 752. Moreover, the lid 720 and sealing material 730 prevent the coating material 780 from bleeding onto the active area 714 of the chip. Any bleeding of the encapsulant 780 onto the outer surface of the lid can simply be wiped off, so that the image sensor chip has an unobstructed view through the lid. Thus, the lid and sealing material permit application of the encapsulant without damaging the image sensor of the chip. By contrast, it is extremely difficult, and usually impractical, to apply an encapsulant over wire bonds connected to an unprotected, "bare" image sensor chip having no lid. Most typically, elements such as turrets holding lenses and other optical elements are mounted over an image sensor chip. The encapsulant 780 protects the wire bonds during such mounting and during other operations, and thus prevents damage to the wire bonds.

The recesses 732 are preferably tapered, as illustrated by wall 733, and are open at the edge of the lid. This configuration facilitates application of the encapsulant. If encapsulant is applied into the recesses in a viscous liquid or other flowable condition, the encapsulant will tend to drain out of the recesses at the edge of the unit and flow onto the substrate, in a direction toward the contact pads 760 of the circuit panel.

Figure 15A:
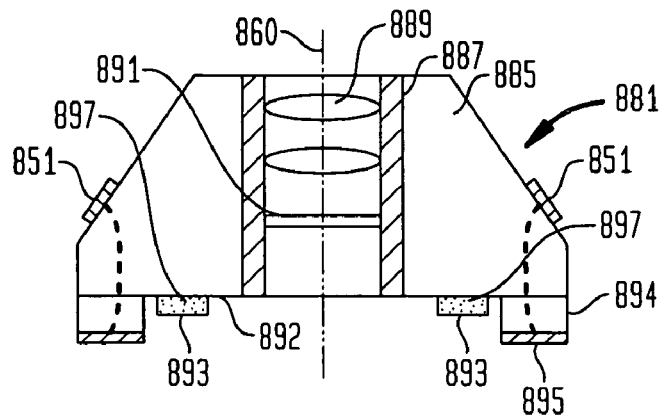
FIG. 15A is a cross-sectional view of a component used in another embodiment of the invention.
Figure 15B:
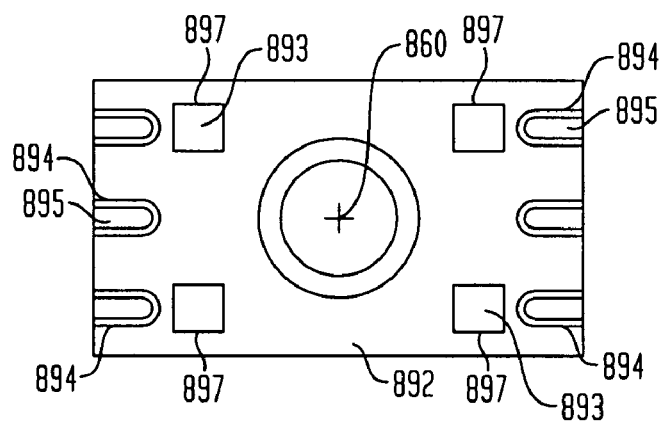
FIG. 15B is a bottom plan view of the component of FIG. 15A.
Figure 15C:
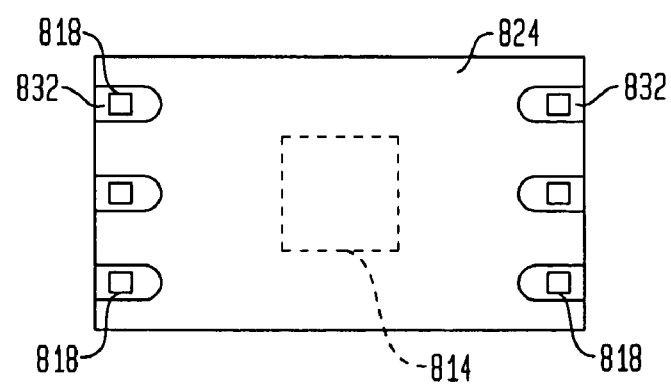
FIG. 15C is a top plan view of a unit usable with the component of FIGS. 15A and 15B.
Figure 15D:
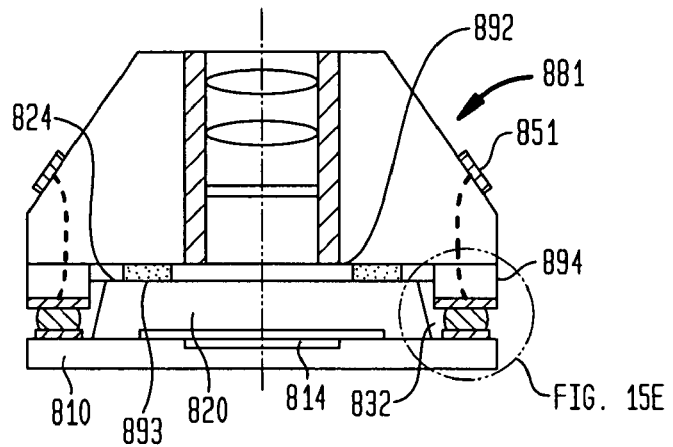
FIG. 15D is a sectional view depicting an assembly including the component of FIGS. 15A and 15B and the unit of FIG. 15C.

An assembly according to yet another embodiment of the invention includes a sensor unit having a chip 810 and a lid 820 (FIGS. 15C and 15D). The chip and lid are substantially as shown and described above with reference to FIGS. 1-5, and are formed by the same process as discussed with reference to those figures. Here again, the lid 820 has an outer surface 824 and recesses 832 open to edges of the lid, such recesses extending downwardly from the outer surface 824 to the front surface of the chip so that contacts 818 of the chip are exposed in the recesses. In this embodiment as well, lid 820 is substantially transparent at least in that region of the lid overlying the active optical sensing region 814 of chip 810. The outer surface 824 of the lid is parallel, within a close tolerance, to the plane of the optical sensing region 814.

The assembly also includes an optical unit having a turret 881 (FIGS. 15A and 15B). The turret may be generally as described in U.S. patent application Ser. No. 11/121,434, the disclosure of which is hereby incorporated by reference herein. In the embodiment depicted, the turret 881 includes both an outer shell 885 and an inner barrel 887 mounted to the outer shell 885. The optical unit further includes optical elements such as lenses 889 mounted to the inner barrel 887 of the turret 883 and one or more wavelength-selective filters 891, also mounted within the inner barrel 887. The optical elements, and particularly lenses 889, are arranged along an optical axis 860 and arranged to focus an image onto a plane perpendicular to this axis. Optionally, inner barrel 887 may be mounted for adjustment in upward and downward directions along the optical axis 860.

The shell 885 of turret 881 has a main surface 892 and abutment elements projecting from the main surface. The abutment elements cooperatively define a rear or abutment surface 893 which is perpendicular to optical axis 860. The shell of the turret also has appendages 894 extending rearwardly from the main surface 892 beyond the rear or abutment surface 893. As seen in plan view (FIG. 15B) appendages 894 have shapes that correspond to the shape of the recesses 832 of the sensor unit (FIG. 15C). As least some of the appendages 894 include electrically conductive features 895 exposed at a bottom surface of the appendages. The electrically conductive features 895 are electrically connected to terminals 851 on the turret, as schematically shown in FIG. 15A.

Figure 15E:
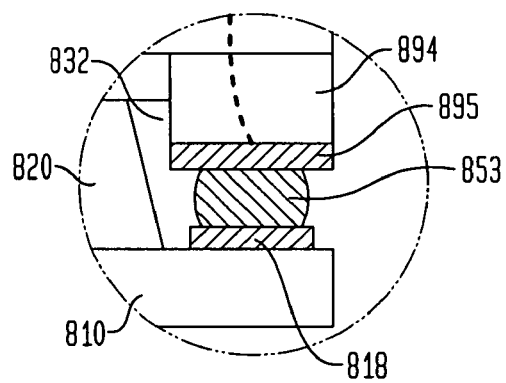
FIG. 15E is a fragmentary sectional view on an enlarged scale depicting the area indicated in FIG. 15D.

In the assembled condition (FIG. 15D), the turret 881 of the optical unit is assembled to the sensor unit so that the rear or abutment surface 893 of the turret bears on the outer surface 820 of the lid. This assures that the optical axis 860 of the optical unit will be precisely perpendicular to the plane of the optical sensing region 814 of the chip 810. The appendages project 894 of the turret project into the recesses 832 of the lid, so that the electrically conductive features 895 of the turret confront the contacts 818 of the chip 810. In this embodiment, the appendages 894 and conductive features 895 are spaced slightly from the contacts 818 of the chip, as best seen in FIG. 15E. The conductive features 895 and contacts 818 are electrically connected to one another by a bonding material 853 (FIG. 15E). This electrically connects the chip to terminals 851 of the turret. The terminals 851 of the turret in turn can be electrically connected to a larger circuit.

The appendages and bonding material do not interfere with engagement between the abutment surface 893 and lid outer surface 824. For example, the conductive features may be solder-bonded to contacts 818, so that when the solder is in a molten condition, surface tension of the solder will tend to draw the turret rearwardly towards the chip 810 and lid 820. The appendages may fit closely within recesses 832, so that the engaged appendages and recesses control the position of the turret 881 relative to the chip 810 in directions perpendicular to the optical axis. Additionally, an adhesive may be disposed in the recesses so as to more securely hold the turret 881 to lid and chip.

In addition, because the outer surface 824 of the lid 820 lies at a precise elevation above the active image sensing area 814, the optical elements such as lenses 889 will be at predetermined precise height above the active area 814. Therefore, the optical elements will provide a well-focused image on the active area.

In the embodiment of FIGS. 15A-15E, turret 883 has horizontal dimensions in a plane perpendicular to optical axis 860 that are approximately equal to or slightly smaller than the corresponding dimension of the chip 810 and lid 820. As discussed in greater detail in the aforementioned U.S. patent application Ser. No. 11/121,434, and in copending, commonly assigned International Application PCT/US05/15714, filed May 4, 2005, the disclosure of which is also incorporated by reference herein, the sensor unit (chip 810 and lid 820) may be disposed in whole or in part on the opposite side of a circuit panel from the optical unit (turret 881). For example, a circuit panel (not shown) may extend between the main surface 892 of the turret and the lid 820 of the sensor unit. Projections 897 and appendages 894 may extend through holes in the circuit panel, and an opening may be provided in the circuit panel in alignment with the optical axis 860 and active sensor region 814 of the chip. In a further embodiment, the appendages 894 and electrically conductive elements 895 of the turret may project laterally beyond the edges of the lid. In this arrangement, the projecting portions of conductive elements 894 may serve as terminals to connect the assembly to a larger circuit.

Figure 16:
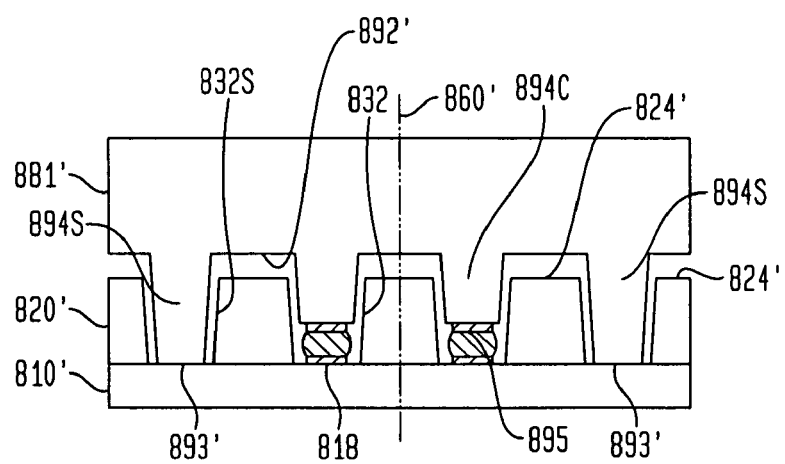
FIG. 16 is a cross-sectional view of an assembly according to a further embodiment of the invention.

In a further embodiment, (FIG. 16) the angle between the optical axis 860' and image sensing device of chip 810' is set by the engagement between the appendages and surfaces within the recesses. In this embodiment some of the appendages are spacer appendages 894S, which do not include conductive features. Further, the spacer appendages 894S have a length along an axis parallel to the optical axis 860A, which is greater than the thickness of the lid 820'. The ends of the spacer appendages define an abutment surface 893'. During the assembly process, the spacer appendages 894S are preferably aligned with spacer recesses 832S. Spacer recesses 832S are similar to the other recesses 832 in the lid, but do not include a contact disposed therein. The abutment surface 893' on the ends of the spacer appendages contact the front surface of chip 810. The other appendages 894C may have electrically conductive features 895 thereon, and these conductive features may be bonded to the contacts 818 of the chip disposed in the other recesses 832 in the same manner discussed above. The main surface 892' of the turret does not come into contact with the outer surface 824' of the lid 820'.

In a variant of the embodiments discussed above with reference to FIGS. 15A-15E and 16, at least one appendage and one recess may be constructed with a particular configuration that only enables that particular appendage to be received within that particular recess. For example, one appendage may be larger than the others, and one recess may be larger than the others. This feature ensures that the optical unit or turret is mounted in only one position onto the sensor unit or chip and lip; if the correct appendage is not aligned with the correct recess, the assembly can not be completed.

Figure 17A:
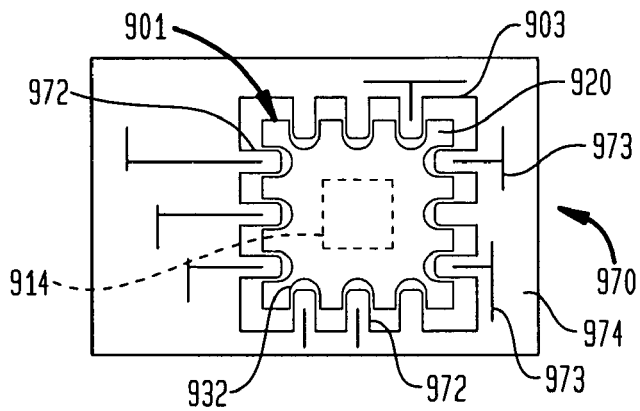
FIGS. 17A is a top plan view depicting an assembly according to yet another embodiment of the invention.
Figure 17B:
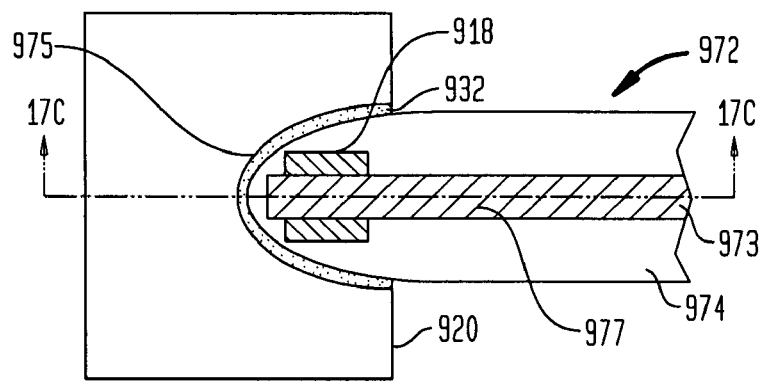
FIG. 17B is a fragmentary view on an enlarged scale depicting a portion of the assembly of FIG. 17A.
Figure 17C:
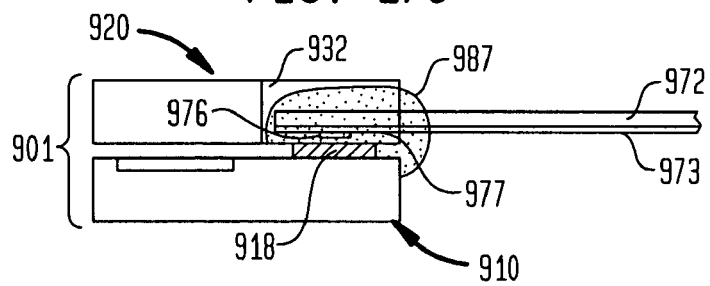
FIG. 17C is a fragmentary sectional view along line 17C-17C in FIG. 17B.

In an assembly according to a further embodiment of the invention, as shown in FIGS. 17A-17C, an individual unit 901 including a chip 910 and lid 920 having a scalloped edge with the contacts of the chip exposed in recesses 932 as discussed above is directly mounted to a circuit panel such as a rigid or flexible printed circuit 970. The circuit panel includes a dielectric substrate 974 and one or more layers of conductive, typically metallic traces 973 interconnected with one another in a pattern dictated by the electrical requirements to be met by the circuit. Where the circuit panel 970 is flexible, it may include a flexible dielectric substrate such as a polyimide, BT resin or similar material. The circuit panel 970 includes a plurality of fingers 972, each finger including an elongated portion of the dielectric substrate and a trace 973 disposed on or within the dielectric substrate. The fingers 972 are actually extensions of the circuit panel 970 and can act as flaps, allowing the fingers to flexibly pivot relative to the remainder of the circuit panel. The traces 973 in the fingers are electrically connected to the other traces of the circuit panel. The traces 973 have end regions 977 on the tips 975 of the fingers (FIG. 17B), these end regions being exposed at a surface of the substrate.

The tips 975 of the fingers 972 are shaped and sized to be placed within the recesses 932 in the lid 920 of the unit. As best seen in FIG. 17A, the fingers are arranged around an opening in the circuit panel, so that the fingers project into the opening in a pattern corresponding to the pattern of recesses 932 in the lid 920. Here again, the pattern may be "keyed" so that the fingers will only fit the recesses when the unit 901 is oriented in a particular way. In the embodiment depicted, a single finger 972 is placed within each recess 932 when the unit 901 is assembled to the circuit panel. The end region 977 of each trace at the tip 975 of the finger is brought into engagement with a contact 918 of chip 910 disposed within the recess, and bonded to the contact. For example, each contact 918 may bear a stud bump, 976 and the stud bumps may be ultrasonically or thermosonically bonded to the end regions of the traces. Alternatively or additionally a solder or conductive adhesive may be applied to the contacts or to the end regions of the traces. The traces 973 in the fingers 972 effectively connect the chip to the remainder of the traces in the circuit panel.

As with the wire leads described in FIGS. 1-5, the scalloped walls of outer portion 940 maintain the separation between adjacent fingers 972 disposed in recesses 932. Moreover, because the fingers are received in the recesses, the fingers cannot be misplaced so as to cover the active region 914 of the chip. An adhesive 987 may be dispensed onto the tips 975 of the traces 973 and the contacts 918 so as to secure the two elements together, and mechanically reinforce the connection between the fingers and unit 901. The adhesive extends into the recesses 932. Mechanical reinforcement by the adhesive is particularly useful with a stud-bumped die.

During this entire assembly process, the active image sensor region 914 of the chip is protected by the lid from any debris or unintended contact. Here again, any material such as solder, adhesive, dust or particles coming into contact with the lid may simply be wiped from the lid element such that the image sensor die's sensing ability is not obstructed. The protection against contamination afforded by the lid makes it practical to provide the mechanical reinforcement using the adhesive as discussed above.

Figure 17D:
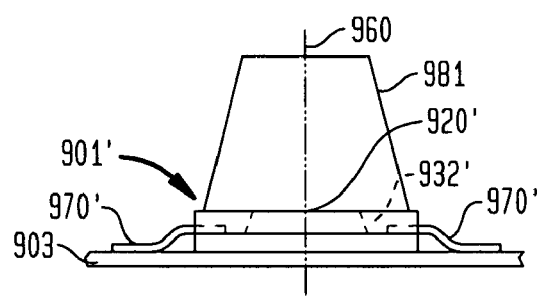
FIG. 17D is an elevational view depicting an assembly according to yet another embodiment of the invention.

In a further embodiment (FIG. 17D), the unit 901' is mounted in face-up disposition on a large circuit panel 903. Small flexible circuit panels 970', each having fingers as discussed above with reference to FIGS. 17A-17C, serve as connectors between the chip 910' and the larger circuit panel 903. In this embodiment as well, the fingers of the small circuit panels extend into recesses 932' of lid 920'. As also shown in FIG. 17D, the finger-type connection can be used in conjunction with an optical unit or turret. The turret 981 is mounted so that it abuts unit 901. The rear or abutment surface of the turret may engage either the outer surface of the lid or the chip, so as to maintain the optical axis 960 perpendicular to the plane of the imaging region. As discussed above with reference to FIG. 16, the turret may include appendages defining the rear or abutment surface, and some of the recesses in the lid may be unoccupied by fingers so that these appendages may contact the chip.

Yet another embodiment of the present invention uses a unit 1001 (FIG. 18) including a chip 1010 and a lid 1020 having a scalloped edge with recesses 1032 having contacts 1018 disposed therein as discussed above. The unit is placed within a cavity 1068 in a substrate such as printed circuit board 1070. The cavity 1068 is simply a cutout disposed within the printed circuit board 1070. By placing the unit 1001 within the cavity 1068, the contacts 1018 disposed in the recesses 1032 at the peripheral area 1016 of the unit 1001 are brought into closer proximity to contact elements 1072 of the printed circuit board 1070, as compared to a circuit board that did not have a cut-out. Stated another way, placing the unit into the cavity minimizes the vertical offset Vo (FIG. 18) between the contacts 1018 and the contact elements 1072. An electrically-conductive material 1080 such as an electrically-conductive adhesive or solder, may be deposited onto the contacts 1018 and contact elements 1072 to thereby electrically connect the two elements. Normally, because the exposed edge of a silicon chip and the die attach adhesive are not wettable by molten solder, it is difficult to force a body of solder to bridge a vertical displacement between the bottom of a vertical interconnect structure and a contact pad on a printed circuit board. Even if this is possible, the joint between the two elements is highly unreliable due to the thermal stresses that arise every time the assembly is subjected to a change in temperature, owing to the difference in the coefficient of thermal expansion of the unit 1001 and the printed circuit board. By placing the contacts 1018 and contact elements 1072 in similar vertical planes, the stress that the electrically-conductive material 1080 is subjected to is reduced allowing for a more reliable connection. In addition, the scalloped walls 1090, which separate recesses 1032 from one act as a barrier between the mass of electrically-conductive material 1080 used to connect a single contact 1018 to a single contact element 1072 and an adjacent mass used to connect adjacent contacts and contact elements.

Further, the tapered walls defining the recesses 1032 may be employed to guide the electrically-conductive material 1080. In such an embodiment, the electrically-conductive material 1080 is deposited within the recesses 1032. The material bleeds outwardly from the recesses at the open sides of the recesses. The tapered walls direct the material toward the contact element 1072 most adjacent to the recess in which the particular mass of electrically-conductive material is deposited into. The conducting material maintains communication with the contact 1018 in the recess 1032 during this process, while the conductive material extends beyond the edge of the unit 1010 and into communication with the contact element 1072.

Figure 18:
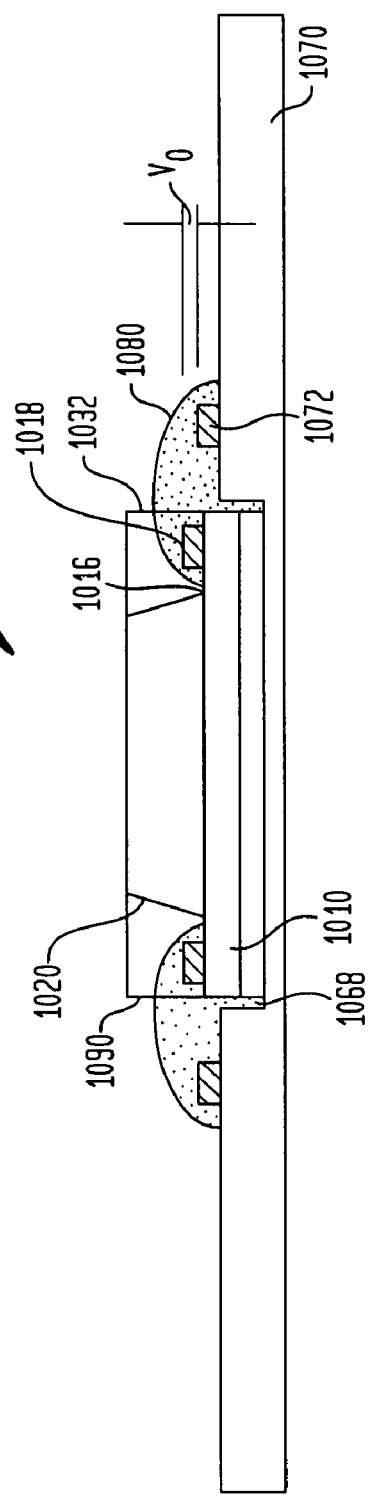
FIG. 18 is a sectional elevational view of an assembly according to yet another embodiment of the invention.

In the embodiment of FIG. 18, the electrically-conductive material is added to the assembly after the chip is placed onto the circuit panel. In an alternate embodiment, the conductive material is placed in the recesses during the process used to make the unit. As discussed above with reference to FIGS. 1-5, the holes 32 formed in the lid element 20 and sealing material 30 as may be filled with an electrically-conductive material such as solder. Thus, when the wafer element 10 and lid element 20 are severed along boundaries 19, as also shown in FIGS. 1-5, the solder-filled holes are also severed so as to provide solder-filled recesses in each individual region or unit. Solder or other conductive bonding materials may be introduced into the holes of a lid element by placing numerous solder balls into the holes using a stenciling process similar to that normally used to distribute solder masses in surface-mounting operations. Alternatively, the masses may be applied by sequentially emplacing individual masses of bonding material using a process as disclosed in the co-pending, commonly assigned U.S. patent application of Kenneth Allen Honer, entitled "Sequential Fabrication Of Vertical Conductive Interconnects In Capped Chips," filed Dec. 28, 2005, the disclosure of which is incorporated by reference herein. Similar processes may be used to place masses of conductive bonding material into the recesses in the scalloped edges of individual units.

Figure 19:
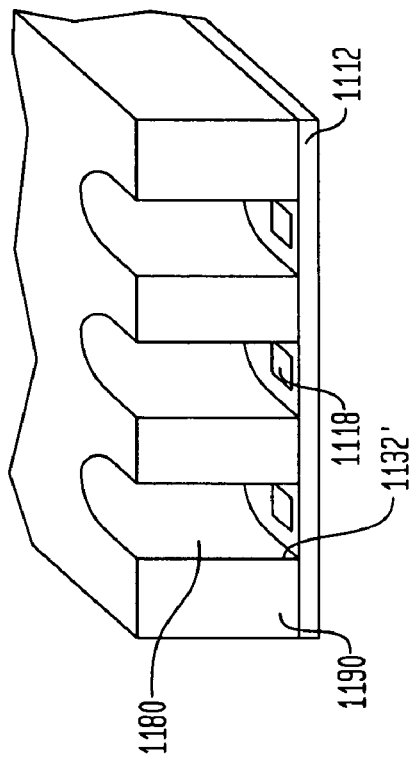
FIG. 19 is a fragmentary perspective view of a unit according to an additional embodiment of the present invention.

A perspective partial view of an individual region or unit 1112, according to this embodiment, is shown in FIG. 19. The individual region 1112 includes recesses 1132' with contacts 1118 disposed therein. The recesses 1132' are defined by scallop walls 1190 and are filled entirely or partially with masses of solder 1180. The process using this unit may be substantially as described above with reference to FIG. 18. Thus, the individual region or unit 1112 may be placed within the cavity of a printed circuit board as discussed in conjunction with the embodiment shown in FIG. 18. As with the embodiment shown in FIG. 18, the contacts 1118 of unit 1112 are preferably vertically aligned with contact elements on the printed circuit board. In order to electrically connect contacts 1118 to the contact elements on the printed circuit board, the unit 1112 on the printed circuit board is heated to above the melting point of the solder. As the temperature of the solder rises, the solder begins to flow out of the recesses 1132'. Because the recesses 1132' are preferably defined by tapered sidewalls, the flow of the solder 1180 from out of the recess 1132' may be somewhat controlled such that the solder flows in a direction away from the tapered sidewalls and onto and over contact elements of the printed circuit board. Other processes using lidded chips with solder-filled recesses are described in commonly assigned U.S. patent application Ser. No. 10/949,844, the disclosure of which is hereby incorporated by reference herein. Once the solder 1180 has been allowed to flow over the contact elements of the printed circuit board while still remaining in communication with the contacts 1118 of the individual region 1112, the solder may be cooled such that an electrical connection is made between the contacts 1118 and the contact element of the printed circuit board.

Figure 20:
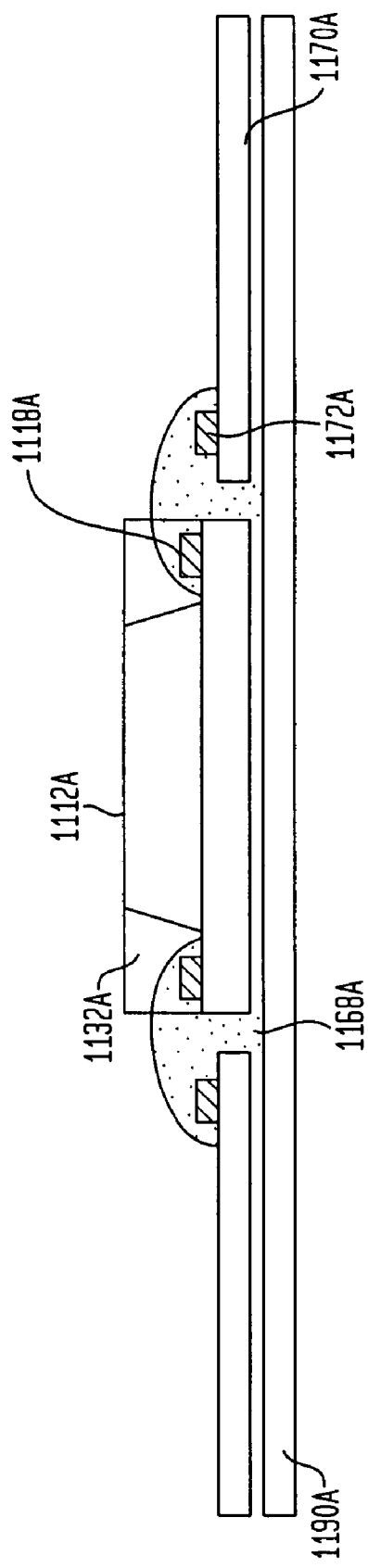
FIG. 20 is a sectional elevational view of an assembly according to yet another embodiment of the present invention.

As shown in FIG. 20, the unit 1101A may be disposed in a hole 1168A extending entirely through a printed circuit board 1170A. The printed circuit board 1170A, as well as the unit 1101A, may both be disposed on an additional substrate 1190A that supports the two elements. By placing the unit 1101A within the hole 1168A, the contacts 1118A of the individual region 1112A may be brought into a vertical plane that is at least proximate the vertical plane of the conductive pads 1172A of the printed circuit board 1170A. As discussed with the embodiments shown in FIGS. 18 and 19, an electrically-conductive material such as solder or a conductive adhesive may be applied to electrically connect the contacts 1118A to the conductive pads 1172A. Alternatively, solder already disposed within the recesses 1132A may be reflowed so as to form a bridge between the contact 1118A and conductive pads 1172A.

In a variant of the process discussed above with reference to FIGS. 4 and 5, the process of severing the lid element and the wafer element is controlled so as to form the outer portions of the scalloped edges of the lid at a location which is not flush with the edge of the chip. For example, if the lid element is severed by a process which removes a relatively large width of the lid element at each severance plane and the wafer element is severed by a different process which removes a lesser width of the wafer element at each severance plane, the chip in each unit will project outwardly beyond the outer portions of the scalloped edges of the lid in each unit.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic device comprising:
   (a) a chip having a front surface and a rear surface, said front surface including an active region and a plurality of contacts exposed at said front surface outside of said active region;
   (b) a lid overlaying said front surface of said chip, said lid having an outer surface, an inner surface, and edges bounding said lid, at least one of said edges including one or more outer portions and one or more recesses extending laterally inwardly from said outer portions, said recesses being formed by one or more surfaces oblique to said outer surface of said lid, said contacts being aligned with said recesses and exposed through said recesses.

2. The device as claimed in claim 1 further comprising a seal extending between said lid and said chip around said active region.

3. The device as claimed in claim 2, wherein said seal extends to said outer portions.

4. The device as claimed in claim 1, wherein said chip has a rear surface and edges bounding said front and rear surfaces.

5. The device as claimed in claim 4, wherein said outer portions of said edges of said lid are aligned with one or more edges of said chip.

6. The device as claimed in claim 1, further comprising clips having first portions being disposed in said recesses and engaging said contacts, said clips extending laterally outwardly beyond the lid.

7. The device as claimed in claim 6, wherein said clips include second portions overlying said rear surface of said chip.

8. The device as claimed in claim 1, further comprising conductive features disposed on said lid remote from said chip, said conductive features being electrically connected to said contacts.

9. The device as claimed in claim 8, further comprising wire bonds extending between said conductive features and said contacts, said conductive features being electrically connected to said contacts by said wire bonds.

10. A microelectronic device comprising:
    (a) a chip having a front surface and a rear surface, said front surface including an active region and a plurality of contacts exposed at said front surface outside of said active region;
    (b) a lid overlaying said front surface of said chip, said lid having an outer surface, an inner surface, and edges bounding said lid, at least one of said edges including one or more outer portions and one or more recesses, said contacts being aligned with said recesses and exposed through said recesses; and
    (c) a turret having a main surface and a plurality of appendages extending from said main surface, said appendages extending into at least some of said recesses.

11. The device as claimed in claim 10 wherein at least some of said appendages have electrically conductive features thereon, said conductive features on said appendages being electrically connected to at least some of said contacts.

12. The device as claimed in claim 10, wherein at least some of said appendages define an abutment surface, said abutment surface abutting said front surface of said chip.

13. The device as claimed in claim 10 wherein said turret defines an abutment surface separate from said appendages, said abutment surface abutting said lid.

14. The device as claimed in claim 10 wherein said recesses have walls extending towards and away from said chip and at least one of said appendages abuts a wall of at least one of said recesses.

15. The device as claimed in claim 10 wherein said chip is an imaging chip having an active region on said front surface, and wherein said lid is at least partially transparent, the device further comprising one or more optical elements carried on said turret for focusing an image on said active region.

16. The device as claimed in claim 1, further comprising an electrically conductive material disposed in at least some of said recesses.

17. An assembly comprising a device as claimed in claim 1, and a substrate, said rear surface of said chip facing downwardly toward said substrate, said front surface of said chip and said lid facing upwardly away from said substrate.

18. The assembly as claimed in claim 17, further comprising leads extending from said contacts to said substrate by way of said recesses.

19. The assembly as claimed in claim 18, further comprising conductive pads on said substrate, wherein said leads connect said contacts to said conductive pads.

20. The assembly as claimed in claim 19 further comprising an encapsulant at least partially covering said leads and extending into said recesses.

21. The assembly as claimed in claim 17, wherein said chip includes a rear surface facing downwardly toward said substrate, further comprising clips extending from said contacts to said rear surface of said chip, said chip being electrically connected to said substrate through said clips.

22. The assembly as claimed in claim 21, wherein said substrate has conductive pads exposed thereon, said clips being bonded to said conductive pads.

23. An assembly comprising a device having:
(a) a chip having a front surface and a rear surface, said front surface including an active region and a plurality of contacts exposed at said front surface outside of said active region;
(b) a lid overlaying said front surface of said chip, said lid having an outer surface, an inner surface, and edges bounding said lid, at least one of said edges including one or more outer portions and one or more recesses extending laterally inwardly from said outer portions, said contacts being aligned with said recesses and exposed through said recesses; and
(c) a substrate, said rear surface of said chip facing downwardly toward said substrate, said front surface of said chip and said lid facing upwardly away from said substrate wherein said substrate includes a cavity and a plurality of conductive pads disposed adjacent said cavity, said chip being disposed in said cavity such that said contacts are proximate said conductive pads.

24. The assembly as claimed in claim 23, wherein said chip includes an edge adjacent said contacts, further comprising an electrically-conductive material extending from said contacts across said edge of said chip and onto said conductive pads of said substrate, portions of said electrically-conductive material being disposed in said recesses.

25. An assembly comprising a device having:
(a) a chip having a front surface and a rear surface, said front surface including an active region and a plurality of contacts exposed at said front surface outside of said active region;
(b) a lid overlaying said front surface of said chip, said lid having an outer surface, an inner surface, and edges bounding said lid, at least one of said edges including one or more outer portions and one or more recesses extending laterally inwardly from said outer portions, said contacts being aligned with said recesses and exposed through said recesses; and
(c) a circuit panel, said circuit panel having fingers extending into at least some of said recesses in said lid, said fingers having traces thereon electrically connected to at least some of said contacts.

26. The device of claim 1 wherein each recess has two sloping surfaces defining an angle between about five degrees and about sixty degrees.

27. The device of claim 1 wherein said one or more recesses have dimensions decreasing progressively from said outer surface of said lid to said front surface of said chip.

* * * * *